(12) United States Patent
Tanaka et al.

(10) Patent No.: US 8,242,770 B2
(45) Date of Patent: Aug. 14, 2012

(54) VOLTAGE SENSING DEVICE

(75) Inventors: Toru Tanaka, Setagaya (JP); Akio Ogura, Yokohama (JP); Kazuya Omagari, Inagi (JP); Nariaki Ogasawara, Yokohama (JP)

(73) Assignee: Texas Instruments Incorporated, Dallas, TX (US)

( * ) Notice: Subject to any disclaimer, the term of this patent is extended or adjusted under 35 U.S.C. 154(b) by 349 days.

(21) Appl. No.: 12/553,375

(22) Filed: Sep. 3, 2009

(65) Prior Publication Data

US 2010/0052656 A1 Mar. 4, 2010

(30) Foreign Application Priority Data

Sep. 3, 2008 (JP) ................................. 2008-226501

(51) Int. Cl.
*G01R 1/30* (2006.01)
*G01R 17/16* (2006.01)
*G01R 19/00* (2006.01)
*G01N 27/416* (2006.01)

(52) U.S. Cl. .................................... 324/123 R; 324/426

(58) Field of Classification Search .................. None
See application file for complete search history.

(56) References Cited

U.S. PATENT DOCUMENTS 7,679,369 B2 * 3/2010 Hartzog et al. ............... 324/426

FOREIGN PATENT DOCUMENTS

JP 2001264366 9/2001

* cited by examiner

*Primary Examiner* — Roberto Velez
(74) *Attorney, Agent, or Firm* — William B. Kempler; Wade J. Brady, III; Frederick J. Telecky, Jr.

(57) ABSTRACT

A voltage sensing device with which high-precision voltage sensing is possible without acquiring a unique correction constant for each device. A pair of voltage input nodes NCk and NCk-1 are selected from n+1 voltage input nodes NC0-NCn in switch part 10, and the selected voltage input nodes NCk and NCk-1 are connected to inspection input nodes NA and NB. Here, voltage input nodes NCk and NCk-1 and inspection input nodes NA and NB are connected in two types of patterns of different polarity (forward connection, reverse connection) under the control of control part 50, and digital data S30 for the two sensed voltage signals S20 generated in the two types of connection patterns is input to sensed data processing part 40. With sensed data processing part 40, sensed voltage data S40 that represents the potential difference between voltage input nodes NCk and NCk-1 is generated according to the difference in the two sensed voltage signals S20.

20 Claims, 15 Drawing Sheets

VOLTAGE SENSING DEVICE

CROSS-REFERENCE TO RELATED APPLICATIONS

This patent application claims priority from Japanese Patent Application No. 2008-226501, filed 3 Sep. 2008, the entirety of which is incorporated herein by reference.

TECHNICAL FIELD

The present invention pertains to a voltage sensing device that senses the voltage applied between nodes that are at different electrical potentials relative to a reference potential; more specifically, it relates to a voltage sensing device that senses the voltage of each cell of a secondary battery that has a plurality of cells that are connected in series, for example.

BACKGROUND OF THE INVENTION

When a battery supplies energy to the drive system of a hybrid automobile or the like, generally, a voltage of around several hundred V is required; such batteries are often configured by connecting many secondary cells, such as lithium ion batteries, in series. When many secondary cells are connected in series, voltage variations occur because the characteristics of the individual cells are different. During charging, for example, the voltage of some cells may be too high and cause problems, such as damage or fire. For this reason, circuitry is generally provided to sense the voltage of each of the secondary cells connected in series and prevent the occurrence of overvoltages.

In Japanese Kokai Patent Application No. 2001-264,366, a voltage sensing device is described with which the voltage of each module in multiple cell modules that are connected in series is sensed. The voltage sensing device described in FIG. 6 in Japanese Kokai Patent Application No. 2001-264,366, for example, is provided with a multiplexer that selects two nodes from the individual connection nodes of the multiple cell modules connected in series, a differential amplifying type voltage sensing circuit that senses the voltage at the two nodes selected by the multiplexer, and a module voltage correction part that corrects the voltage sensed by the differential amplifying type voltage sensing circuit based on a prescribed correction equation.

With the voltage sensing device described in Japanese Kokai Patent Application No. 2001-264,366, a node of each cell module is first selected by the multiplexer from the multiple cell modules that are connected in series, and the voltage of the selected cell module is sensed by the differential amplifying type voltage sensing circuit. The sensed value is recorded in the module voltage correction part whenever necessary. Then when the sensed voltage values for all the cell modules are acquired, the accurate voltage for each cell module is calculated using the prescribed correction equation.

With the voltage sensing device shown in Japanese Kokai Patent Application No. 2001-264,366, a constant used for correction calculation based on a correction equation in the module voltage correcting part must be acquired before the product is shipped. That is, during pre-shipment inspection, a reference voltage source is connected in place of the cell module and its voltage is sensed, so that the necessary constant is calculated with a prescribed algorithm based on the sensed voltage value obtained. However, this makes pre-shipment inspection time-consuming, and there is also the problem that the same operation is required when a device is to be replaced after shipment. There is also the problem that increased errors due to temporal changes are unavoidable, since the same constant that was acquired at the time of shipment continues to be used.

In addition, with the voltage sensing device shown in Japanese Kokai Patent Application No. 2001-264,366, it is necessary to sense the voltage of all the cell modules in order to obtain the voltage value for each cell module. Because the processing in the module voltage correction part is relatively complicated, in Japanese Kokai Patent Application No. 2001-264,366, it is realized with a microcomputer. Then to acquire an accurate voltage value for each cell module, it is necessary to follow the steps in which each of the sensed values for all the cell modules undergoes analog/digital conversion, the obtained data is transmitted to the microcomputer, and correction calculation is executed based on the data transmitted to the microcomputer. That is, there is the problem that a great amount of time is required until the voltage values are ascertained. When the cell module voltage is monitored to judge abnormalities, such as overvoltages, there is the possibility that such a time delay will become a problem from the standpoint of safety. There is also the problem of increased circuit area and power consumption, since a microcomputer is used.

SUMMARY OF THE INVENTION

The present invention was devised in consideration of this situation, and has a general object to provide a voltage sensing device with which voltage can be sensed with high precision without acquiring a unique correction constant for each device.

The voltage sensing device pertaining to a first aspect of the present invention comprises multiple voltage input nodes; a pair of sense input nodes; a switch part provided with multiple switches that turn connections between the aforementioned voltage input nodes and the aforementioned pair of sense input nodes on or off; a first sensed signal generating part that amplifies the voltage input to each of the aforementioned pair of sense input nodes with a different gain and generates a first sensed signal according to the sum of or difference between said amplification results; a control part that controls the aforementioned switch part so that a pair of voltage input nodes is selected from the aforementioned multiple voltage input nodes, and said selected pair of voltage input nodes and the aforementioned pair of sense input nodes are connected in two types of patterns to different polarity; and a second sensed signal generating part that generates a second sensed signal according to the difference between the aforementioned two first sensed signals generated by the aforementioned first sensed signal generating part in the aforementioned two types of connection patterns.

With the aforementioned voltage sensing device, a pair of voltage input nodes from the multiple voltage input nodes may be selected by the switch part, and said pair of selected voltage input nodes are connected to the aforementioned pair of sense input nodes. In this case, the aforementioned pair of voltage input nodes and the aforementioned pair of sense input nodes are connected in two types of patterns of different polarity under the control of the aforementioned control part, and the two first sensed signals generated with the two types of connection patterns are input to the aforementioned second sensed signal generating part.

With the aforementioned second sensed signal generating part, the aforementioned second sensed signal, which represents the potential difference between the aforementioned pair of voltage input nodes, is generated according to the difference between the two first sensed signals.

In this aspect of the invention, the aforementioned first sensed signals generated by the aforementioned first sensed signal generating part include a fixed error, which is not dependent on the voltage at the aforementioned pair of sense input nodes, due to the effect of the input offset voltage etc. The error component is approximately equal to the two first sensed signals generated with the aforementioned two types of patterns. Thus, in the aforementioned second sensed signal generated according to the difference between said two first sensed signals, said error components cancel out and become extremely small.

At the same time, with the aforementioned first sensed signal generating part, the voltage input to each of the aforementioned pair of sense input nodes is amplified with a different gain, and the aforementioned first sensed signals are generated according to the sum of or the difference between the amplification results, so even though the difference in the aforementioned two first sensed signals generated with the aforementioned two types of patterns is found, rather than the two voltage components input to the aforementioned pair of sense input nodes being cancelling out, a component corresponding to the difference between said two voltage components remains. Therefore, the aforementioned second sensed signal will be a signal corresponding to the difference between the aforementioned pair of voltage input nodes.

In one aspect, the aforementioned first sensed signal generating part could also have a signal generating part that keeps each of the pair of input nodes at a reference potential while also generating the aforementioned first sensed signal according to the sum of or the difference between the current input to said pair of input nodes, and two input resistors that connect the aforementioned pair of input nodes of the aforementioned signal generating part, and the aforementioned pair of sense input nodes one to one.

The aforementioned voltage sensing device could also have a changeover part that switches connections between the aforementioned pair of input nodes and the aforementioned two input resistors of the aforementioned signal generating part, and a first judgment part that determines whether there are abnormalities in the aforementioned switch part and the aforementioned input resistors. In this case, the aforementioned two input resistors could have approximately equal resistance values. The aforementioned control part, in a first inspection mode, could also control the aforementioned switch part, so that a pair of voltage input nodes from the aforementioned multiple voltage input nodes is selected and said selected pair of voltage input nodes, and the aforementioned pair of sense input nodes are connected in two types of patterns of different polarity; and it could control the aforementioned changeover part so that in each of said two types of patterns, the aforementioned pair of input nodes and the aforementioned two input resistors of the aforementioned signal generating part are connected in two types of patterns of different polarity.

With the configuration described above, the aforementioned two input resistors have approximately equal resistance values, and the aforementioned pair of input nodes is held at the aforementioned reference potential, so that the current flowing from one voltage input node to one input node will be approximately equal, regardless of the aforementioned input resistors present in the current paths.

If the currents input to the aforementioned pair of input nodes are equal, the aforementioned first sensed signals generated by the aforementioned signal generating part will be equal.

Thus, in the aforementioned first inspection mode, the aforementioned two first sensed signals generated with two types of connection patterns in which the connection relationships between the aforementioned pair of the aforementioned voltage input nodes and the aforementioned pair of the aforementioned input nodes are equal, and the aforementioned input resistors, which are inserted in each of the connection paths between the aforementioned pair of the aforementioned voltage input nodes and the aforementioned pair of the aforementioned input nodes, are different, will be approximately equal. Whether there are abnormalities in the aforementioned switch part and the aforementioned input resistors is determined by the aforementioned judgment part according to the difference between said two first sensed signals.

Note that the aforementioned second signal generating part, in the aforementioned first inspection mode, could also generate the aforementioned second sensed signal according to the difference between the aforementioned two first sensed signals generated by the aforementioned first sensed signal generating part when the aforementioned changeover part makes the aforementioned two types of connections while connections formed by the aforementioned switch part are maintained. The aforementioned first judgment part could also, in the aforementioned first inspection mode, perform the aforementioned judgment based on the aforementioned two second sensed signals generated by the aforementioned second sensed signal generating part when the aforementioned switch part has connected the aforementioned two types of patterns.

This relationship is not established when an abnormality occurs in at least one of the aforementioned two input resistors, or when an abnormality occurs in the aforementioned switch part.

Therefore, in the aforementioned first inspection mode, whether there are abnormalities in the aforementioned input resistors or the aforementioned switch part is determined by comparing the aforementioned two second sensed signals generated by the aforementioned second sensed signal generating part when the aforementioned switch part has connected the aforementioned two types of patterns.

In this aspect, the aforementioned multiple voltage input nodes could also comprise a pair of sensing nodes to which a reference voltage is input. The aforementioned control part, in a second inspection mode, could also control the aforementioned switch part so that the aforementioned pair of inspection nodes and the aforementioned pair of sensing input nodes is connected in two types of patterns of different polarity. The aforementioned voltage sensing device could also have a second judgment part that compares the aforementioned second sensed signals generated in the aforementioned second inspection mode with a reference value set according to the aforementioned reference voltage and determine whether there are abnormalities in the aforementioned first sensed signal generating part based on the result of said comparison.

With the configuration described above, in the aforementioned second inspection mode, the aforementioned pair of inspection nodes and the aforementioned pair of sense input nodes are connected in two types of connection patterns of different polarity, and the aforementioned second sensed signals are generated based on the aforementioned two first sensed signals generated in said two types of connection patterns. The second sensed signals represent the sensed voltage value for the aforementioned reference voltage, so that whether there are abnormalities in the aforementioned first sensed signal generating part is determined based on the result of comparison of a reference value set based on the aforementioned reference voltage and said second sensed signals.

Note that the aforementioned second sensed signal generating part, in the aforementioned second inspection mode, could also generate the aforementioned second sensed signals according to the aforementioned two first sensed signals generated by the aforementioned first sensed signal generating part when the aforementioned switch part has connected the aforementioned two types of patterns with connections by the aforementioned changeover part held the same. The aforementioned judgment part, in the aforementioned second inspection mode, could also determine whether there are abnormalities in the aforementioned first sensed signal generating part, based on the result of comparison of the aforementioned reference value and each of the aforementioned two second sensed signals generated by the aforementioned second sensed signal generating part when the aforementioned changeover part has formed two types of connection patterns of different polarity.

Thus, whether there are abnormalities in the aforementioned first inspection signal generating part is determined for each of the aforementioned two types of connection patterns in the aforementioned changeover part.

The aforementioned voltage sensing device could also have an analog/digital conversion part that converts the aforementioned first sensed signals and the aforementioned reference voltage to digital data. The aforementioned second judgment part, in the aforementioned second inspection mode, could also determine whether there are abnormalities in the aforementioned first inspection signal generating part, based on the result of comparison of the aforementioned second sensed signals generated according to the two digital data in which the aforementioned two first sensed signals generated by the first sensed signal generating part have been converted by the aforementioned analog/digital conversion part, and the aforementioned reference value set according to digital data in which the aforementioned reference voltage has been converted by the aforementioned analog/digital conversion part.

The aforementioned reference value is thereby updated according to changes in the aforementioned reference voltage.

In one aspect, the aforementioned signal generating part could also have a first amplifying part that amplifies the difference between the voltage at one of the input nodes of the aforementioned pair of input nodes and the aforementioned reference voltage, a first resistor that connects the output node of the aforementioned first amplifying part and the aforementioned one input node, a second amplifying part that amplifies the difference between the voltage at the other input node of the aforementioned pair of input nodes and the aforementioned reference voltage, a second resistor that connects the output node of the aforementioned second amplifying part and the aforementioned other input node, and a third resistor that connects the output node of the aforementioned first amplifying part and the aforementioned other input node.

In one aspect, each switch of the aforementioned switch part could also have two transistors of the same conductivity type connected in series, a constant-voltage element connected between the control terminals of the aforementioned two transistors and an intermediate connection node, and a drive circuit that supplies common drive current to the control terminals of the aforementioned two transistors.

The aforementioned voltage sensing device could also have multiple sensing modules, each of which comprises the aforementioned switch part, the aforementioned pair of sense input nodes, and the aforementioned first sensed signal generating part, and a selection part that selects one of the sensing modules from the aforementioned multiple sensing modules and inputs the aforementioned first sensed signals generated by the aforementioned first sensed signal generating part of said selected sensing module to the aforementioned second sensed signal generating part.

DETAILED DESCRIPTION

In the figures, elements 10,11,11-1,11-2,13 represent switch parts, 20,21,21-1,21-2 voltage sensing parts, 30 an analog/digital conversion part, 40 a sensed data processing part, 50-54 control parts, 60,70 judgment parts, 80,81 selection parts, 201a signal generating part, 202 a changeover part, A1,A2 operational amplifier circuits, CEL1-CELn battery cells, CM1,CM2 current sources, D1,D2 constant-voltage elements, M1-Mn sensing modules, NC0-NCn voltage input nodes, NA,NB,NA1,NA2,NB1,NB2 sense input nodes, Qn1-Qn5,Qp1-Qp4 MOS transistors, R1,R2,Rs2,Rf1,Rf2 resistors, Rs1,Rs3 input resistors, and SA0-SAn,SB0-SBn,SP1-SP4,SW1-SW4 switches.

With the present invention, it is possible to cancel error components caused by the input offset voltage without acquiring a unique correction constant for each device, so that voltage can be sensed with high precision.

First Embodiment

Figure 1:
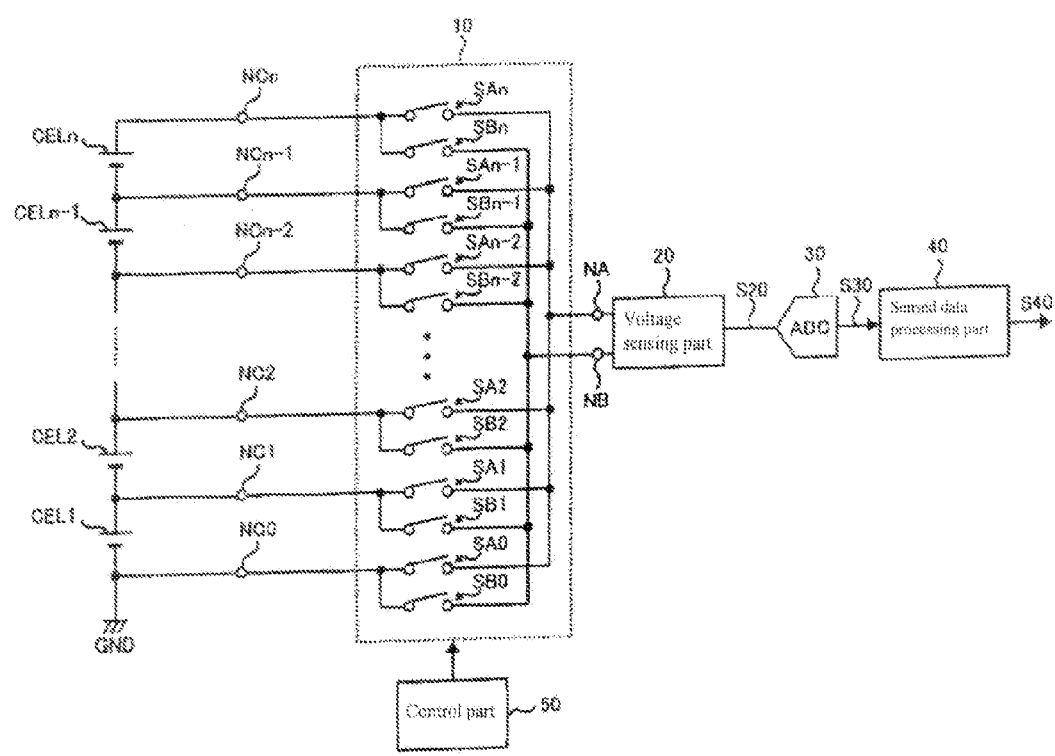
FIG. 1 shows an example of the configuration of a voltage sensing device pertaining to a first embodiment.

FIG. 1 shows an example of the configuration of a voltage sensing device pertaining to a first embodiment of the present invention.

The voltage sensing device shown in FIG. 1 is a device that senses the voltage of each cell of battery cells CEL1-CELn, which are connected in series, and has voltage input nodes NC0-NCn, a switch part 10, sense input nodes NA and NB, a voltage sensing part 20, an analog/digital conversion part 30, a sensed data processing part 40, and a control part 50. Switch part 10 has switches SA0-SAn and SB0-SBn.

Voltage input nodes NC0-NCn are one embodiment of the multiple voltage input nodes of the present invention. Sense input nodes NA and NB are one embodiment of the pair of sense input nodes of the present invention. Switch part 10 is one embodiment of the switch part of the present invention. Voltage sensing part 20 is one embodiment of the first sensed signal generating part of the present invention. Control part 50 is one embodiment of the control part of the present invention. Sensed data processing part 40 is one embodiment of the second sensed signal generating part of the present invention.

The voltage at each terminal of battery cells CEL1-CELn that are connected in series is supplied to voltage input nodes NC0-NCn, respectively. The voltage at the negative terminal of cell CEL1 connected to ground potential GND is applied to voltage input node NC0, and for voltage input node NCk (where k represents an integer from 1 to n), the voltage at the positive terminal of battery cell CELk is applied.

Switches SA0-SAn and SB0-SBn of switch part 10 turn connections between voltage input nodes NC0-NCn and sense input nodes NA and NB on or off, based on the control signal from control part 50. Switch SAj (where j represents an integer from 0 to n) turns the connection between voltage input node NCj and sense input node NA on or off, and switch SBj turns the connection between voltage input node NCj and sense input node NB on or off.

Figure 2A:
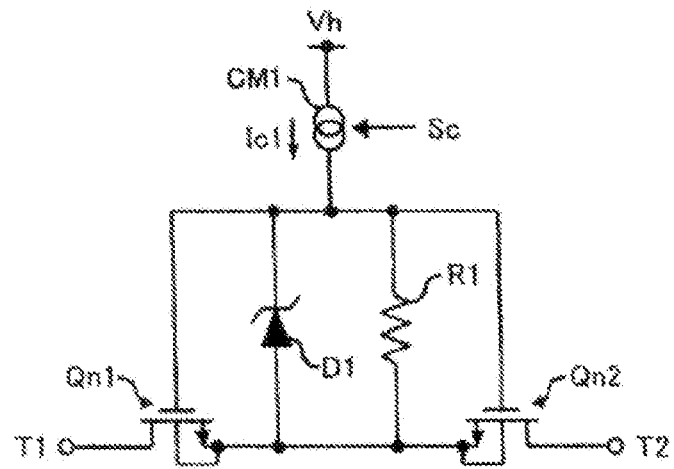
FIGS. 2(A) and 2(B) show an example of the configuration of the switches in the switch part.

FIG. 2(A) is a first figure showing an example of the configuration of switches SA0-SAn and SB0-SBn.

The switches shown in FIG. 2(A) have NMOS transistors Qn1 and Qn2, the two sources of which are connected in common, a constant-voltage element D1, such as a Zener diode, connected between the source and gate of MOS transistors Qn1 and Qn2, a resistor R1 connected in parallel with constant-voltage element D1, and a current source (drive circuit) CM1 that supplies drive current Ic1 to the gates of MOS transistors Qn1 and Qn2. Current source CM1 supplies drive current IC1 from potential Vh which is sufficiently higher than the potential of both terminals T1 and T2 of the switch. The NMOS transistors Qn1 and Qn2 have a structure for high withstand voltage called extended drain, LOCOS offset drain etc.

When current source CM1 generates drive current IC1 in response to drive signal Sc1, current flows to resistor R1, and a voltage is dropped across the gates and sources of MOS transistors Qn1 and Qn2. This biasing of MOS transistors Qn1 and Qn2 turns on the switch. The gate-source voltage of MOS transistors Qn1 and Qn2 is limited to a fixed value by constant-voltage element D1.

Figure 2B:
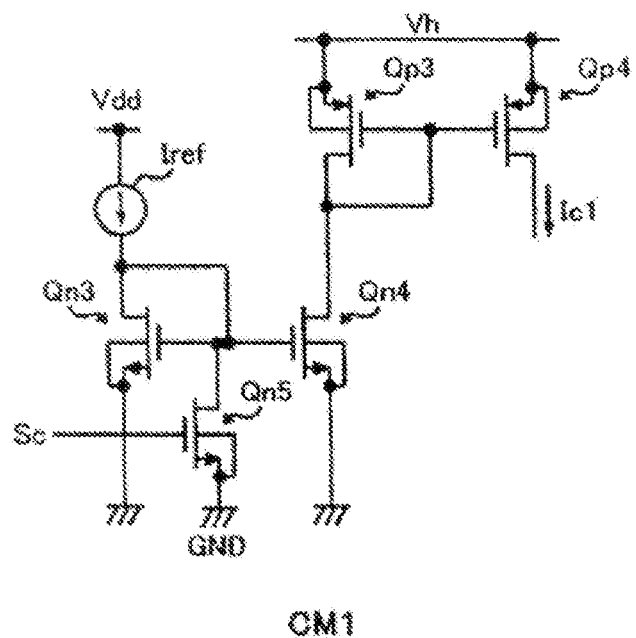

FIG. 2(B) shows an example of the configuration of current source CM1.

Current source CM1 shown in FIG. 2(B) has NMOS transistors Qn3 and Qn4, which constitute a current mirror circuit referenced to ground potential GND, PMOS transistors Qp3 and Qp4, which constitute a current mirror circuit referenced to voltage Vh, which is sufficiently higher than the voltage of both terminals T1 and T2 of the switch, and nMOS transistor Qn5 for turning offset current on and off.

The gate and drain of MOS transistor Qn3 are connected together and the source is connected to ground potential GND, and the drain sinks reference current Iref. The gate of MOS transistor Qn4 is connected to the gate of MOS transistor Qn3, the source is connected to ground potential GND, and the drain is connected to the drain of MOS transistor Qp3. The gate and drain of MOS transistor Qp3 are connected together, the source is connected to potential Vh, and the drain current is output to the drain of MOS transistor Qn4. The gate of MOS transistor Qp4 is connected to the gate of MOS transistor Qp3, the source is connected to potential Vh, and drive current Ic1 is output from the drain. MOS transistor Qn5 is connected between the gate of MOS transistor Qn3 and ground potential GND, and is turned on or off in response to control signal Sc which is input to the gate.

The generation of drive current Ic1 from current source CM1 shown in FIG. 2(B) is controlled by turning MOS transistor Qn5 on or off.

When MOS transistor Qn5 is off, reference current Iref flows to MOS transistor Qn3, and a current proportional to the reference current also flows to MOS transistor Qn4, to which the same gate voltage as MOS transistor Qn3 is input. MOS transistor Qn4 and MOS transistor Qp3 have the same drain current. Current proportional to the drain current of MOS transistor Qp3 flows from MOS transistor Qp4, which is at the same gate voltage as MOS transistor Qp3, which is output as drive current Ic1. Therefore, current source CM1 sends current proportional to reference current Iref from the high-potential side to the gates of MOS transistors Qn1 and Qn2.

Turning on MOS transistor Qn5 short circuits the gates and sources of MOS transistors Qn3 and Qn4, so that no current flows to transistors Qn3 and Qn4, and the current in MOS transistors Qp3 and Qp4 is thus zero. Therefore, drive current Ic1 from current source CM1 is zero.

Figure 3A:
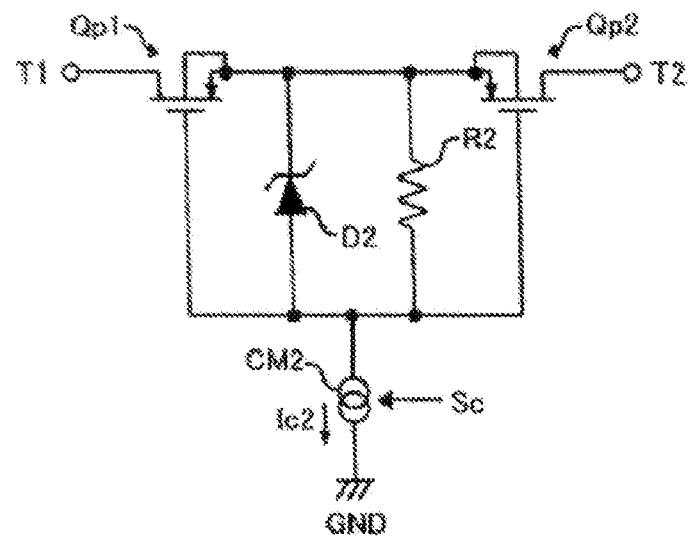
FIGS. 3(A) and 3(B) show an example of the configuration of the switches in the switch part.

FIG. 3(A) is a second figure showing an example of the configuration of switches SA0-SAn and SB0-SBn.

The switch shown in FIG. 3(A) comprises PMOS transistors Qp1 and Qp2, the sources of which are interconnected; a constant-voltage element D2, such as a Zener diode, connected between the sources and gates of MOS transistors Qp1 and Qp2; a resistor R2 connected in parallel with constant-voltage element D2; and a current source (drive circuit) CM2 that supplies drive current Ic2 to the gates of MOS transistors Pq1 and Qp2. Current source CM2 generates drive current IC2 which flows toward ground potential GND. The PMOS transistors Qp1 and QP2 have a structure for high withstand voltage called extended drain, LOCOS offset drain, etc.

When current source CM2 generates drive current Ic2 in response to control signal Sc, current flows through resistor R2, and a voltage is dropped across the gates and sources of MOS transistors Qp1 and Qp2. This biasing of MOS transistors Qp1 and Qp2 turns on the switch. The gate-source voltage of MOS transistors Qp1 and Qp2 is clamped to a fixed value by constant-voltage element D2.

Figure 3B:
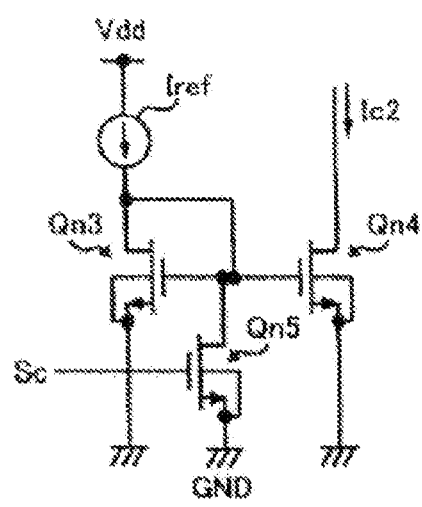

FIG. 3(B) shows an example of the configuration of current source CM2.

The high potential-side current mirror circuit (MOS transistors Qp3 and Qp4) of current source CM1 shown in FIG. 2(B) that constitutes current source CM2 has been omitted from FIG. 3(B); the drain current of MOS transistor Qn4 is drive current Ic2.

The foregoing was an explanation of current source 10.

Reference is again made to FIG. 1. Voltage sensing part 20 generates a sensed voltage signal S20 according to the difference in voltages input to sense input nodes NA and NB.

Figure 4:
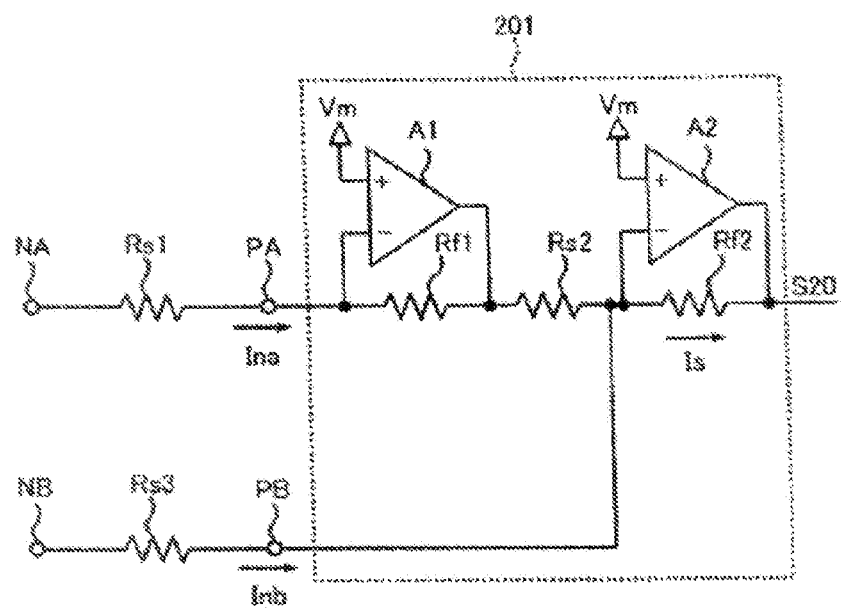
FIG. 4 shows an example of the configuration of the voltage sensing device shown in FIG. 1.

FIG. 4 shows an example of the configuration of voltage sensing part 20.

Voltage sensing part 20 shown in FIG. 4 includes input resistors Rs1 and Rs2 and a signal generating part 201. Signal generating part 201 is one possible embodiment of the signal generating part of the present invention. Input resistors Rs1 and Rs3 are one possible embodiment of the input resistors of the present invention.

Signal generating part 201 holds both input nodes PA and PB at reference potential Vm, and also generates sensed voltage signal S20 according to the sum of or difference between the currents input to input nodes PA and PB. Input resistor RS1 is connected between sense input node NA and input node PA, and input resistor Rs3 is connected between sense input node NB and input node PB.

Signal generating part 201 has operational amplifier circuits A1 and A2, and resistors Rf1, Rs2 and Rf2 as shown in FIG. 4, for example. Operational amplifier circuit A1 is one possible embodiment of the first amplifying part of the present invention. Operational amplifier circuit A2 is one possible embodiment of the second amplifying part of the present invention. Resistor Rf1 is one possible embodiment of the first resistor of the present invention. Resistor Rf2 is one possible embodiment of the second resistor of the present invention. Resistor Rs2 is one possible embodiment of the third resistor of the present invention.

The negative input node of operational amplifier circuit A1 is connected to input node PA, the positive input node is connected to reference potential Vm, and the output node is connected to the negative input node via resistor Rf1. Resistor Rs2 is connected between the output node of operational amplifier circuit A1 and the negative input node of operational amplifier circuit A2. The negative input node of operational amplifier circuit A2 is connected to input node PB, the positive input node is connected to reference potential Vm, and the output node is connected to the negative input node via resistor Rf2. Resistors Rf1, Rs2, and Rf2 have the resistance value rf1, rs2, and rf2, respectively.

The operation when current Ina is input to input node PA and current Inb is input to sense input node PB will now be explained.

The voltage generated at the output node of operational amplifier circuit A1 holds input node PA at reference voltage Vm. When current Ina is input to input node PA, operational amplifier circuit A1 generates voltage "−rf1×Ina" at the output node relative to reference potential Vm. Operational amplifier circuit A2, on the other hand, also generates a voltage at the output node to hold input node PB at reference voltage Vm. Since input node PB is held at reference voltage Vm, there is a potential difference of "−rf1×Ina" across resistor Rs2. Therefore, current "−(rf1/rs2)×Ina" flows to resistor Rs2. This current and current Inb input from sense input node NB are added and flow to resistor Rf2. That is, current Ina and current Inb are added in the ratio "−(rf1/rs2):1", and the total current Is flows to resistor Rf2. Operational amplifier circuit A2 generates voltage "−Is×rf2" relative to reference potential Vm, which appears at the output as sensed voltage signal S20.

Reference is again made to FIG. 1. Analog/digital conversion part 30 converts sensed voltage signal S20 output from voltage sensing part 20 into digital data with a prescribed bit length. Control part 50 controls switch part 10 to sense the voltage of each battery cell CEL1-CELn in voltage sensing part 20. That is, control part 50 controls switch part 10 to select two voltage input nodes from voltage input nodes NC0-NCn, and connect said two selected voltage input nodes and sense input nodes NA and NB with two types of patterns of different polarity.

For example, when control part 50 selects voltage input nodes NCk and NCk-1 (k=1–n), two types of connections are provided—a pattern in which voltage input node NCk and sense input node NA are connected, and voltage input node NCk-1 and sense input node NB are connected (hereafter also referred to as a "forward connection"), and a connection pattern in which voltage input node NCk and sense input node NB are connected, and voltage input node NCk-1 and sense input node NA are connected (hereafter referred to as a "reverse connection").

Sensed data processing part 40 generates sensed voltage data S40 that represents the precise voltage of each battery cell CEL1-CELn, based on digital data S30 output from analog/digital conversion part 30. That is, sensed data processing part 40 acquires two digital data S30 generated when the pair of voltage input nodes selected by control part 50 and sense input nodes NA and NB are connected in the aforementioned two types of patterns (forward connection, reverse connection), and generates sensed voltage data S40 representing the voltage input to voltage input nodes NCk and NCk-1, according to the difference between the two digital data S30 acquired.

Here, the operation of a voltage sensing device pertaining to this embodiment, which has the configuration described above, will now be explained.

Control part 50 selects one cell in sequence from the individual battery cells CEL1-CELn, and connects a pair of voltage input nodes connected to the positive electrode of the selected cell and sense input nodes NA and NB in two types of patterns (forward connection, reverse connection).

Figure 5A:
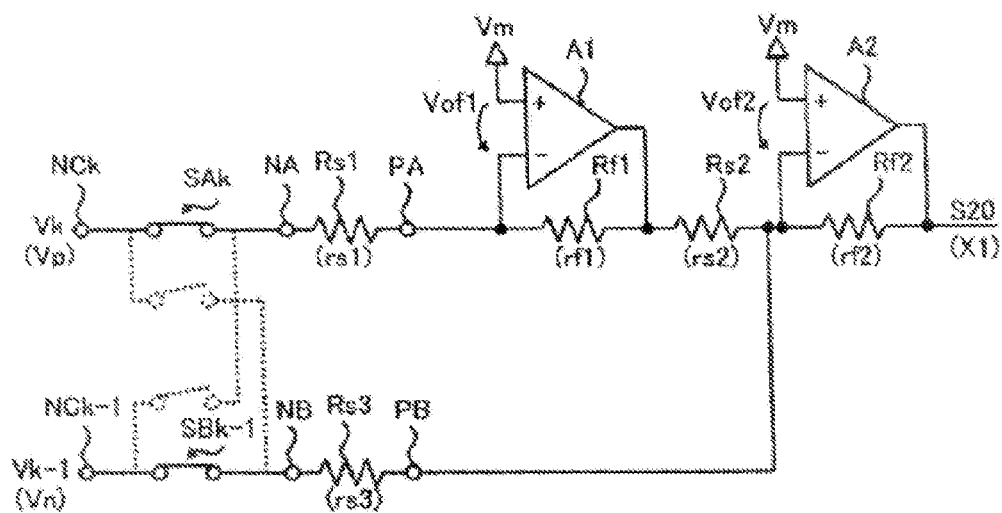
FIGS. 5(A) and 5(B) show connection patterns in the switch part in the voltage sensing device shown in FIG. 1.
Figure 5B:
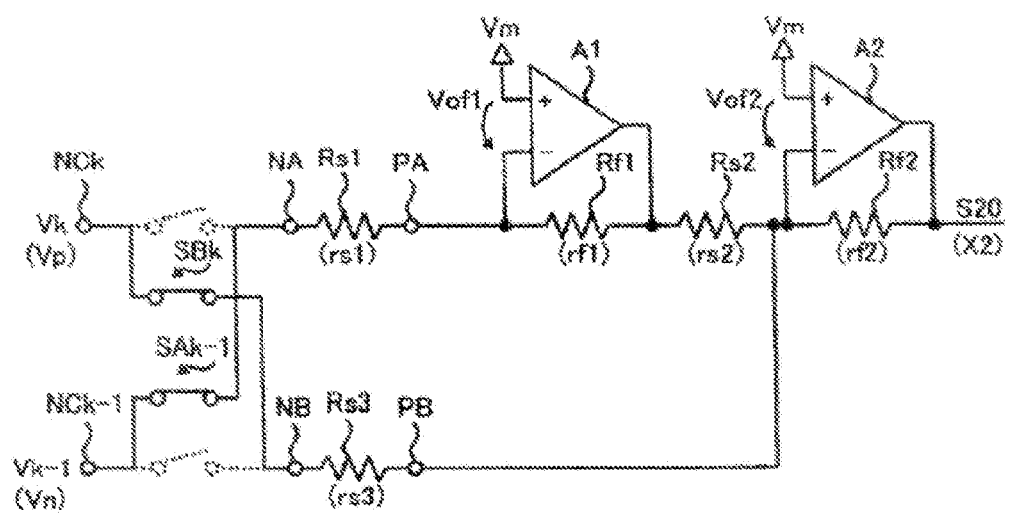

FIG. 5(A) shows the case in which voltage input nodes NCk and NCk-1 and sense input nodes NA and NB are forward-connected, and FIG. 5(B) shows the case in which they are reverse-connected. As shown in FIGS. 5(A) and 5(B), control part 50 turns switches SAk and SBk-1 on and the other switches off in the forward-connection, and turns switches SAk- and Sbk on and the other switches off in the reverse connection.

If the voltage value of sensed voltage signal S20 with forward connection (FIG. 5(A)) is "X1" and the voltage value of sensed voltage signal S20 with reverse connection (FIG. 5(B)) is "X2," "X1" and "X2" are represented by the following equations.

Equations 1 [and 2]

$$X1 = \frac{rf1 \cdot rf2}{rs1 \cdot rs2} \times Vp - \frac{rf2}{rs3} \times Vn - \frac{rf1 \cdot rf2}{rs1 \cdot rs2} \times Vof1 + \left(\frac{rf2}{rs2} + \frac{rf2}{rs3}\right) \times Vof2 \qquad (1)$$

$$X2 = \frac{rf1 \cdot rf2}{rs1 \cdot rs2} \times Vn - \frac{rf2}{rs3} \times Vp - \frac{rf1 \cdot rf2}{rs1 \cdot rs2} \times Vof1 + \left(\frac{rf2}{rs2} + \frac{rf2}{rs1}\right) \times Vof2 \qquad (2)$$

In equations (1), (2), "Vp" represents the voltage at voltage input node Nck, "Vn" the voltage at voltage input node NCk-1, "rs1" the resistance value of input resistor Rs1, "rs3" the resistance value of input resistor Rs3, "Vof1" the input offset voltage of operational amplifier circuit A1, and "Vof27" the input offset voltage of operational amplifier circuit A2.

Sensed data processing part 40 acquires digital data s30 for "X1" and "X2" represented by equations (1) and (2), and calculates the difference between the two as sensed voltage data S40.

Difference "Xdif" between "X1" and "X2" is represented by the following equation.

Equation 2

$$Xdif = X1 - X2 = \left(\frac{rf1 \cdot rf2}{rs1 \cdot rs2} + \frac{rf2}{rs3}\right) \times (Vp - Vn) \qquad (3)$$

As can be seen from equation (3), in sensed voltage data S40 (Xdif) generated in sensed data processing part 40, the input offset voltage components in the third term and the fourth term on the right side of equations (1) and (2) are cancelled out, and the value of voltages (Vp-Vn) of the two voltage input nodes multiplied by a fixed proportional constant is obtained.

As explained above, with the voltage sensing device pertaining to this embodiment, a pair of voltage input nodes NCk and NCk-1 is selected in switch part 10 from n+1 voltage input nodes NC0-NCn, and the selected voltage input nodes NCk and NCk-1 are connected to sense input nodes NA and NB. In this case, voltage input nodes NCk and NCk-1 and sense input nodes NA and NB are connected in two types of patterns of different polarity (forward connection, reverse connection) under the control of control part 50, digital data S30 for the two sensed voltage signals S20 generated in the two types of connection patterns are input to sensed data processing part 40. Sensed data processing part 40 generates sensed voltage data S40, which represents the potential difference between voltage input nodes NCk and NCk-1, according to the difference between the two digital data S30.

Here, in sensed voltage signals S20 generated by voltage sensing part 20, a fixed error independent of the voltage at sense input nodes NA and NB is produced due to the effect of the input offset voltage. The error components are approximately equal in the two sensed voltage signals S20 generated in the two types of connection patterns (forward connection, reverse connection). Thus, in sensed voltage data S40, said error components are cancelled out by finding the difference between the two sensed voltage signals S20.

With sensed voltage part 20, on the other hand, the voltages input to sense input nodes NA and NB are amplified with different gains, and sensed voltage signal S20 is generated according to the sum of or difference between the amplification result, so that even when the difference in the two sensed voltage signals S20 generated in the two types of patterns (forward connection, reverse connection) is found, rather than the two voltage components input to sense input nodes NA and NB being canceled out, a component corresponding to the difference between said two voltage components remains. Therefore, sensed voltage data S40 has a value corresponding to the difference between voltage input nodes NCk and NCk-1.

Thus, with this embodiment, it is possible to realize high-precision voltage sensing without acquiring a unique correction constant for each device. For this reason, the time devoted to pre-shipment inspection can be reduced, and the tedious task of calibrating devices when they are replaced after shipment becomes unnecessary. Nor are errors produced that are caused by the correction constant deviating from the appropriate value with changes in characteristics over time, so that voltage sensing precision can be improved compared to conventional devices.

With this embodiment, too, merely by simple processing to acquire two data with two connection patterns for the pair of voltage input nodes subject to sensing and calculating the difference, the voltage at said pair of voltage input nodes can be sensed. Therefore, compared with conventional devices with which sensed values could not be ascertained without sensing the voltage at all nodes, the time required for voltage sensing can be significantly reduced. The result is that even when the voltage of each series-connected battery cell is monitored to judge abnormalities, such as overvoltages, judgment results can be obtained sufficiently rapidly, and reliability can be improved.

In addition, with this embodiment, because voltage sensing results can be obtained merely by the simple processing of calculating the difference between the two data, the device can be realized with a simple hardware configuration without using a microcomputer. The result is that circuit area and power consumption can be significantly reduced, compared with conventional devices.

Also, with this embodiment, as shown in FIG. 2(A) for example, each switch in switch part 10 can be turned on and off with control signal Sc, which is referenced to ground potential GND, so that the circuitry for driving the switches can be simplified.

Second Embodiment

A second embodiment of the present invention will now be explained.

Figure 6:
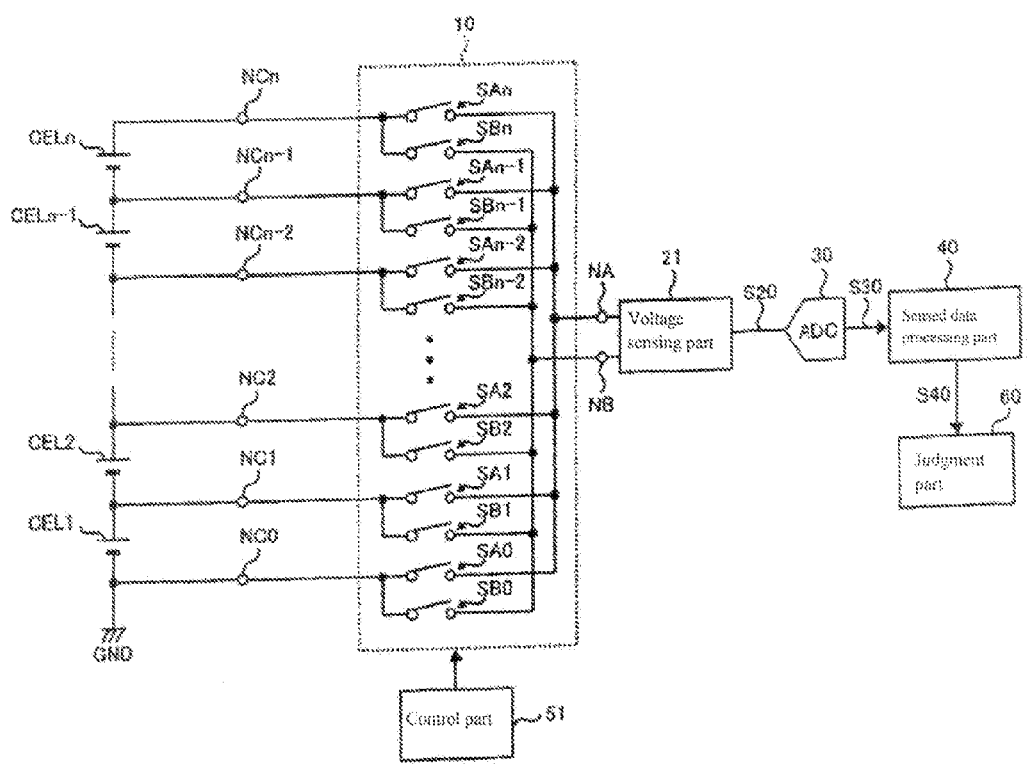
FIG. 6 shows an example of the configuration of a voltage sensing device pertaining to a second embodiment.

The voltage sensing device pertaining to this embodiment is provided with an inspection mode relating to the switch part and to the input resistors. FIG. 6 shows an example of the configuration of a voltage sensing device pertaining to a second embodiment of the present invention.

In the voltage sensing device shown in FIG. 6, voltage sensing part 20 in the voltage sensing device shown in FIG. 1 is replaced with voltage sensing device 21, control part 50 is replaced with control part 51, and a judgment part 60 is also provided. The other symbols in FIG. 1 and FIG. 6 represent the same components.

Judgment part 60 is one possible embodiment of the first judgment part of the present invention.

Figure 7:
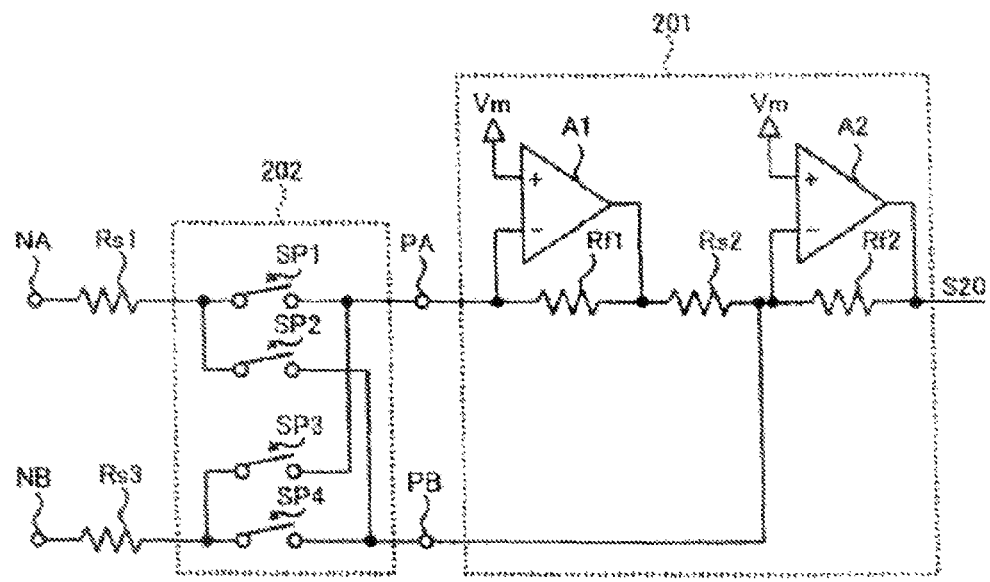
FIG. 7 shows an example of the configuration of the voltage sensing part in the voltage sensing device shown in FIG. 6.

FIG. 7 shows an example of the configuration of voltage sensing part 21.

Voltage sensing part 21 shown in FIG. 7, in addition to having the same configuration as voltage sensing part 20 shown in FIG. 4, also has a changeover part 202 that switches the connections between input nodes PA and PB and input resistors Rs1 and Rs3. Changeover part 202 is provided with four switches SP1-SP4, as shown in FIG. 7, for example. Switch SP1 turns the connection between input resistor Rs1 and input node PA3 on and off, switch SP2 turns the connection between input resistor Rs1 and input node PB on and off, switch SP3 turns the connection between input resistor Rs3 and input node PA on and off, and switch SP4 turns the connection between input resistor RS3 and input node PB on and off.

Figure 8:
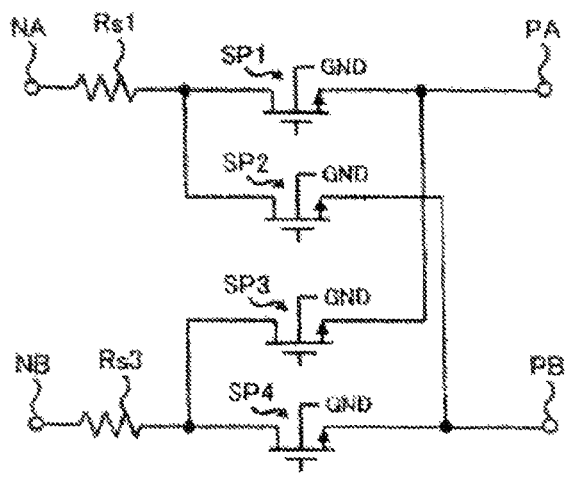
FIG. 8 shows an example of the configuration of the changeover part in the voltage sensing device shown in FIG. 7.

FIG. 8 shows an example of the configuration of individual switches SP1-SP4 of changeover part 202, and an example in which each switch is configured using an NMOS transistor. In this case, the sources of the NMOS transistors that constitute switches SP1-SP4 are connected to input nodes PA and PB, and the drains are connected to one end of input resistors Rs1 and Rs3.

The NMOS transistors have a drain withstand voltage suitable for the voltage applied to voltage input nodes NC0-NCn. The NMOS transistors used could have a structure for high withstand voltage called extended drain, LOCOS offset drain, etc. Input nodes PA and PB are held at reference potential Vm by signal generating part 201, so that the level of the drive signal supplied to the gates of the NMOS transistors may be the same as the logic level of sensed data processing part 40, for example.

Control part 51, in addition to the normal operating mode described above in which the voltage of each battery cell is sensed, has an operating mode (first inspection mode) to inspect circuitry (switch part 10, input resistors) positioned at a stage subsequent to changeover part 22. Control part 51, in normal operating mode, executes control in the same way as control part 50 described above, and in the first inspection mode, in which switch part 10 is inspected, it controls switch part 1p and changeover part 202 as follows. That is, control part 51, in the first inspection mode, controls switch part 10 so that a pair of voltage input nodes from voltage input nodes NC0-NCk is selected, and said selected pair of voltage input nodes and sense input nodes NA and NB are connected in two types of patterns of different polarity, and also controls changeover part 202 so that, in each of the two types of patterns, input nodes PA and PB of signal generating part 201 and input resistors Rs1 and Rs2 are connected in two types of patterns of different polarity.

In the first inspection mode, sensed data processing part 40 generates sensed voltage data S40 the same way as in the normal operating mode, according to the difference between the digital data S20 for the two sensed voltage signals S20 generated by voltage sensing part 20 when changeover part 202 has connected the two types of patterns, with the connections by switch part 10 kept the same.

Judgment part 60, in the first inspection mode, determines whether there are abnormalities in switch part 1p and input resistors Rs1 and Rs3, based on the two sensed voltage data S40 generated by sensed data processing part 40 when switch part 10 has connected the two types of patterns (forward connection, reverse connection).

The operation of the voltage sensing device of FIG. 6 will now be explained.

First, in normal operating mode, control part 51 controls switch part 10 in the same way as control part 50 described previously, with connections between input resistors Rs1 and Rs3 and input nodes PA and PB by changeover part 202 fixed to be constant.

Figure 9A:
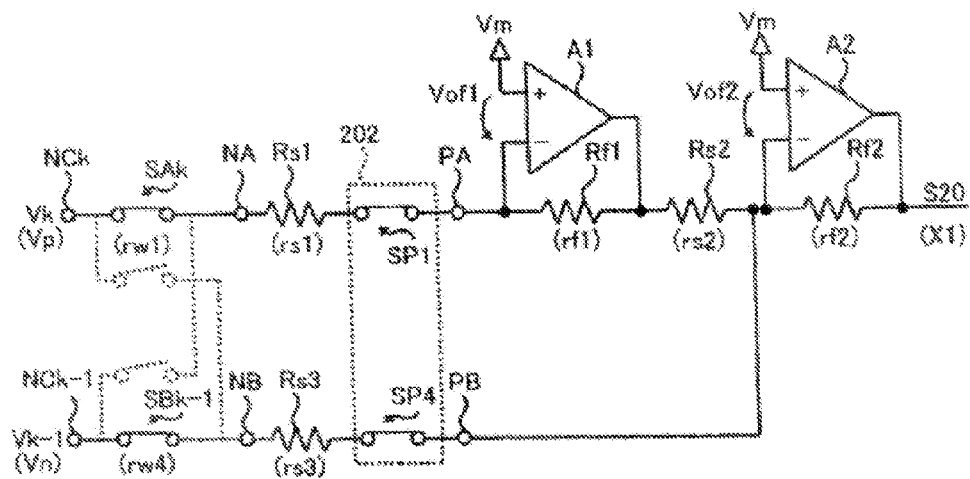
FIGS. 9(A) and 9(B) show connection patterns in the switch part and the changeover part in normal operating mode in the voltage sensing device shown in FIG. 6.
Figure 9B:
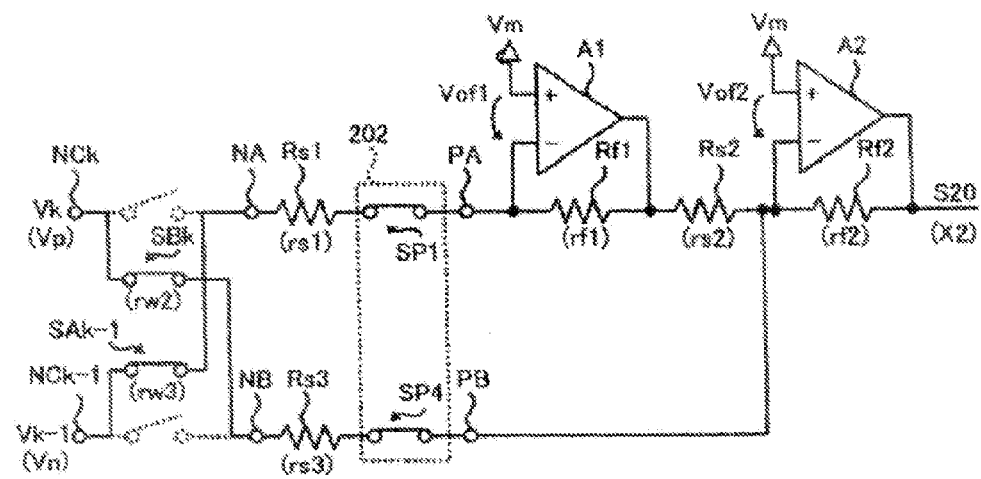

FIGS. 9(A) and 9(B) show the connection patterns by switch part 10 and changeover part 202 in normal operating mode.

Control part 51, as shown in FIGS. 9(A) and 9(B) for example, controls changeover part 202 so that input resistor Rs1 and input node PA are connected, and so that input resistor Rs3 and input node PB are connected. Control part 51 controls switch part 10 so that, while this connection state is maintained, two voltage input nodes, selected from voltage input nodes NC0-NCn, and sense input nodes NA and NB are connected in two types of patterns (forward connection, reverse connection) (FIGS. 9(A) and 9(B)).

Sensed data processing part s40 generates sensed voltage data S40 according to the difference between the two sensed voltage signals S40 generated in the two types of connection patterns. In contrast, in the first inspection mode, the connections are additionally switched by changeover part 202.

FIGS. 1(A) and 10(B), and FIGS. 11(A) and 11(B) are figures showing the connection patterns by switch part 1p and changeover part 202 in the first inspection mode.

Figure 10A:
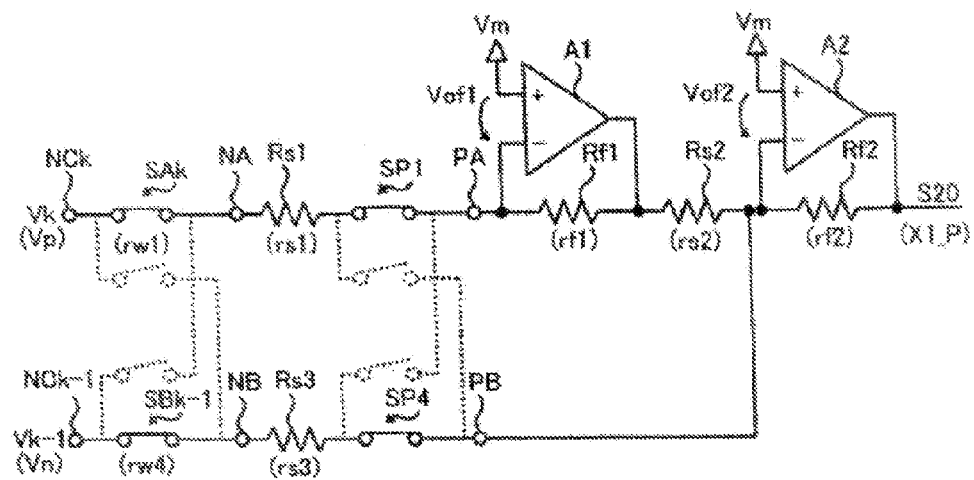
FIGS. 10(A) and 10(B) show connection patterns in the switch part and the changeover part in a first inspection mode in the voltage sensing device shown in FIG. 6.
Figure 10B:
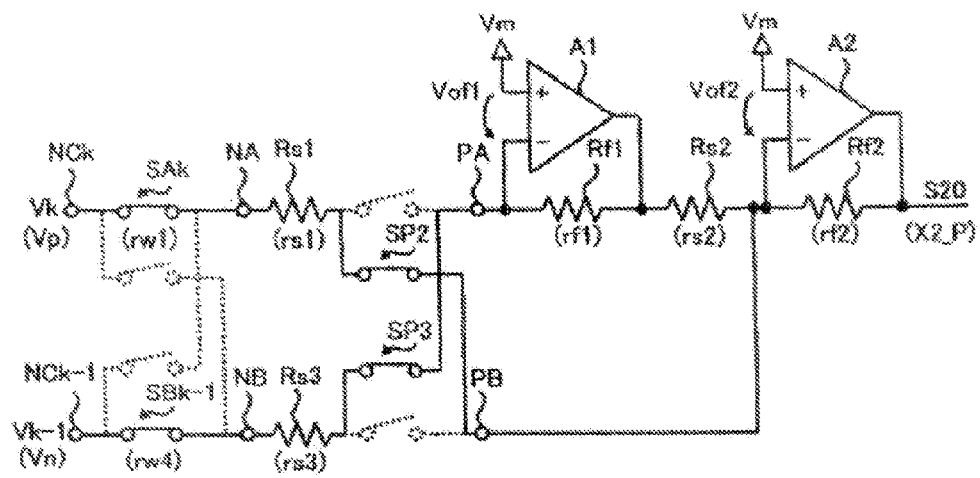

FIGS. 10(A) and 10(B) show the two types of connection patterns between sense input nodes NA and NB and input nodes PA and PB, when voltage input nodes NCk and NCk-1 and sense input nodes NA and NB are connected with single-pole, single-throw switches.

Figure 11A:
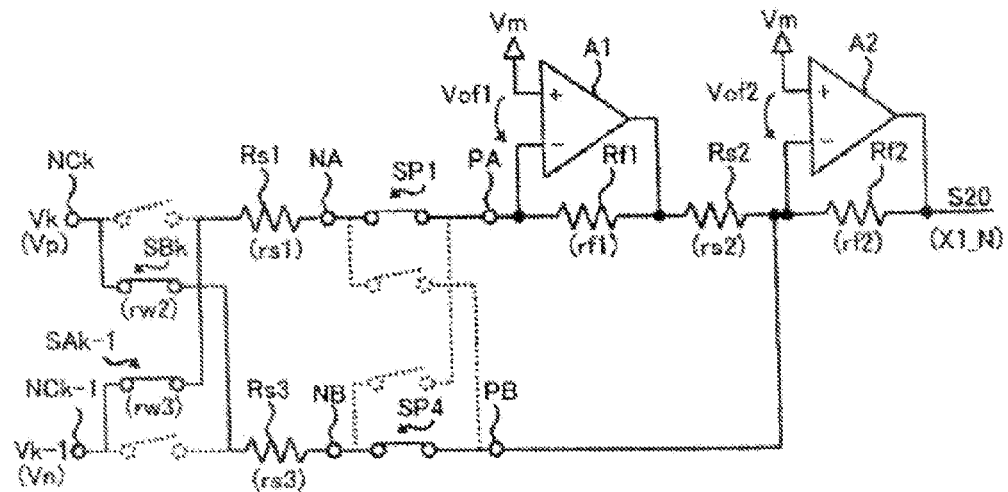
FIGS. 11(A) and 11(B) show connection patterns in the switch part and the changeover part in a first inspection mode in the voltage sensing device shown in FIG. 6.
Figure 11B:
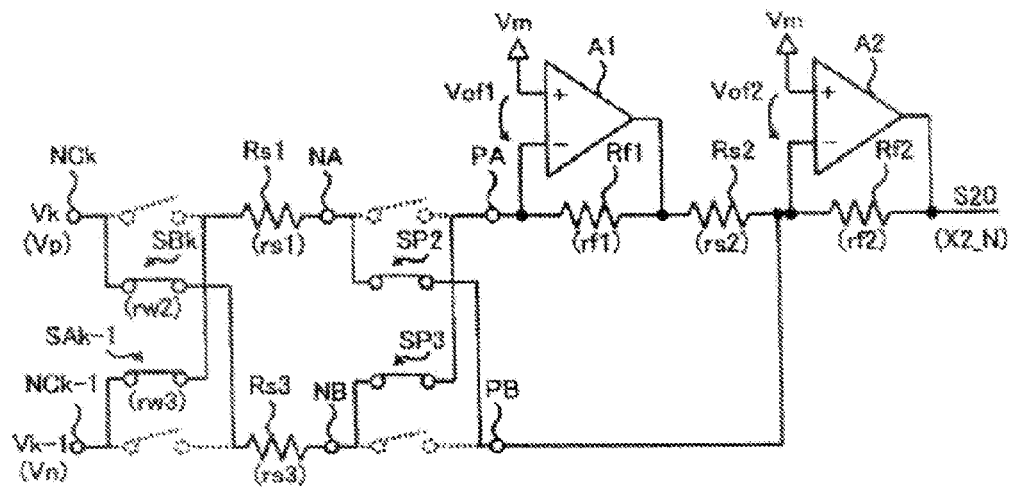

FIGS. 11(A) and 11(B) shows the two types of connection patterns for sense input nodes NA and NB and input nodes PA and PB, when voltage input nodes NCk and NCk-1 and sense input nodes NA and NB are reverse-connected.

In the connection pattern shown in FIG. 10(A), control part 51 turns switches SAk and SBk-1 of switch part 10 on while turning the other switches off, and turns switches SP1 and SP4 of changeover part 202 on while turning the other switches off.

In the connection pattern shown in FIG. 10(B), control part 51 turns switches SAk and SBk-1 of switch part 10 on while turning the other switches off, and turns switches SP2 and SP3 of changeover part 202 on while turning the other switches off.

In the connection pattern in FIG. 11(A), control part 51 turns switches SBk and SAk-1 of switch part 10 on while turning the other switches off, and turns switches SP1 and SP4 of changeover part 202 on while turning the other switches off.

In the connection pattern in FIG. 11(B), control part 51 turns switches SBk and SAk-1 of switch part 10 on while turning the other switches off, and turns switches SP2 and SP3 of changeover part 202 on while turning the other switches off.

If sensed voltage signal S20 generated in the connection pattern in FIG. 10(A) is "X1_P" and sensed voltage signal S20 generated in the connection pattern in FIG. 10(B) is "X2_P," and if the difference between "X1_P" and "X2_P" is "xdif_P," the signals are approximately represented by the following equation.

Equation 3

$$X1\_P = \frac{rf1 \cdot rf2}{rs1p \cdot rs2} \times Vp - \frac{rf2}{rs3p} \times Vn \quad (4)$$

$$X2\_P = \frac{rf1 \cdot rf2}{rs3p \cdot rs2} \times Vn - \frac{rf2}{rs1p} \times Vp \quad (5)$$

$$\begin{aligned} Xdif\_P &= X1\_P - X2\_P \\ &= \left(\frac{rf1 \cdot rf2}{rs1p \cdot rs2} + \frac{rf2}{rs1p}\right) \times Vp - \\ &\quad \left(\frac{rf1 \cdot rf2}{rs3p \cdot rs2} + \frac{rf2}{rs3p}\right) \times Vn \end{aligned} \quad (6)$$

On the other hand, if sensed voltage signal S20 generated in the connection pattern in FIG. 11(A) is "X1_N" and sensed voltage signal S20 generated in the connection pattern in FIG. 11(B) is "X2_N," and if the difference between "X1_N" and "X2_N" is "Xdif_N," the signals can be approximately represented by the following equations.

Equation 4

$$X1\_N = \frac{rf1 \cdot rf2}{rs1n \cdot rs2} \times Vn - \frac{rf2}{rs3n} \times Vp \quad (7)$$

$$X2\_N = \frac{rf1 \cdot rf2}{rs3n \cdot rs2} \times Vp - \frac{rf2}{rs1n} \times Vn \quad (8)$$

$$\begin{aligned} Xdif\_N &= X1\_N - X2\_N \\ &= \left(\frac{rf1 \cdot rf2}{rs1n \cdot rs2} + \frac{rf2}{rs1n}\right) \times Vn - \\ &\quad \left(\frac{rf1 \cdot rf2}{rs3n \cdot rs2} + \frac{rf2}{rs3n}\right) \times Vp \end{aligned} \quad (9)$$

Note that in equations (4)-(9), "rs1p," "rs3p", "rs1n", and "rs3n" represent the resistance values shown in the equations below.

Equation 5

$$rs1p = rw1 + rs1 \quad (10)$$

$$rs3p = rw4 + rs3 \quad (11)$$

$$rs1n = rw3 + rs1 \quad (12)$$

$$rs3n = rw2 + rs3 \quad (13)$$

"nw1" in equations (10)-(13) represents the resistance value when switch SAk is on, "rw2" represents the resistance value when switch SBk is on, "rw3" represents the resistance value when switch SAk-1 is on, and "rw4" represents the resistance value when switch SBk-1 is on.

"Xdif_P" represented by equation (6) corresponds to sensed voltage data S40 generated according to the difference between the two sensed voltage signals "X1_P" and "X2_P" in the two connection patterns shown in FIG. 10. "xdif_N" represented by equation (9) corresponds to sensed voltage data S40 generated according to the difference between the two sensed voltage signals "X1_N" and "X2_N" in the two connection patterns shown in FIGS. 11(A) and 11(B).

Judgment part 60 calculates the sum of "xdif_P" and "xdif_N" corresponding to equations (6) and (9). Here, in the normal state, resistance values "rs1" and "rs3" of input resistors Rs1 and Rs3, respectively, are approximately equal, and on-resistance values "rw1"-"rw4" of switches SP1-SP4 are sufficiently small compared with "rs1" and "rs3." In this case, the first term on the right side of equation (6) is cancelled out by the second term on the right side of equation (9), and the second term on the right side of equation (6) is cancelled out by the first term on the right side in equation (9). Thus, the absolute value "E1" of the sum of "Xdif_P" and "Xdif_N" will be approximately zero, as shown in equation (14) below.

Equation 6

$$rs1 \approx rs3, rw1 \sim rw4 \ll rs1, rs3 \rightarrow E1 = |Xdiff\_P + Xdiff\_N| = 0 \quad (14)$$

Therefore, judgment part 60 compares "E1" with a reference value, and when "E1" exceeds the reference value, it determines that the resistance value of switch part 10 or of an input resistor Rs1 or Rs3 is abnormal.

As explained above, with this embodiment, input resistors Rs1 and Rs3 have approximately equal resistance values, and input nodes PA and PB are held at reference potential Vm, so that the current flowing from voltage input nodes NCk and NCk-1 to input nodes PA and PB will be approximately equal, regardless of input resistors Rs1 and Rs3 which are present in the current path. If the current is input to input nodes PA and PB are also equal, sensed voltage signals S20 generated by signal generating part 201 will also be equal.

Thus, in the first inspection mode, the relationship between sensed voltage data S40 (Xdiff_P) obtained by connecting changeover part 201 in two types of patterns while keeping the connection formed by switch part 10 as a forward connection, and sensed voltage data S40 (Xdif_N) obtained by connecting changeover part 201 in two types of patterns while keeping the connection formed by switch part 10 as a reverse connection, will be equivalent to the relationship between the two sensed voltage data S40 obtained in normal operating mode when voltages of equal magnitude and opposite polarity are sensed. This relationship is not established when an abnormality occurs in at least one input resistor Rs1 or Rs3, or when an abnormality occurs in switch part 10.

Therefore, in the first inspection mode, whether there is an abnormality in input resistors Rs1 and Rs3 or switch part 10 can be determined by comparing the two sensed voltage data S40 generated by sensed data processing part 40 when switch part 10 has connected two types of patterns (forward connection and reverse connection).

With this embodiment, because inspection can be performed at any time, even after the product is shipped, the voltage inspection results can be more reliable. It is determined that there is an overvoltage in a battery cell based on the voltage sensing result, because judgment reliability is improved, the reliability and safety of devices in which the battery cells are incorporated can be increased.

Also, with this embodiment, because switches SP1-SP4 of changeover part 202 are provided between input resistors Rs1 and Rs3 and input nodes PA and PB, drive signals are generated based on reference potential Vm by control part 51, which drives switches SP1-SP4. Therefore, because an isolated power source for driving switches SP1-SP4 need not be provided for each switch, for example, the circuit configuration can be simplified.¥

Third Embodiment

A third embodiment of the present invention will now be explained.

The voltage sensing device pertaining to this embodiment is provided with an inspection mode relating to the voltage sensing part.

Figure 12:
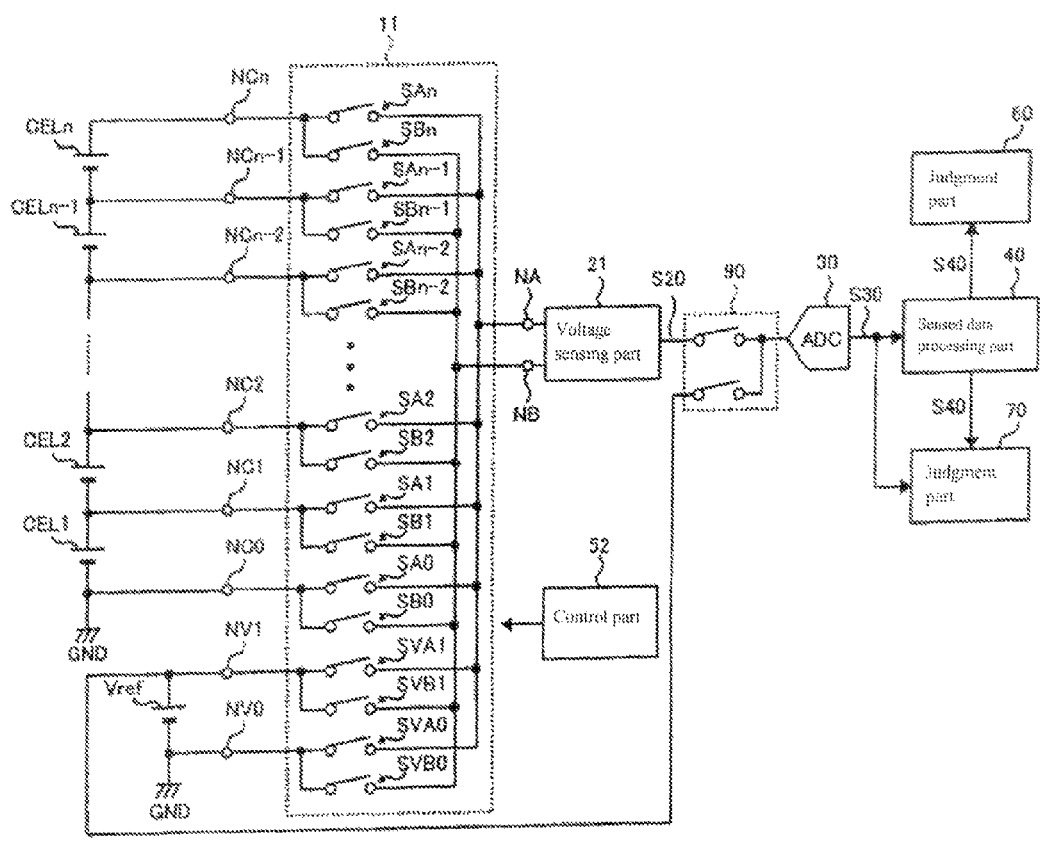
FIG. 12 shows an example of a voltage sensing device pertaining to a third embodiment.

FIG. 12 shows an example of the configuration of a voltage sensing device pertaining to a third embodiment. In the voltage sensing device shown in FIG. 12, switch part 10 in the voltage sensing device shown in FIG. 6 is replaced with a switch part 11, control part 51 is replaced with a control part 52, and inspection nodes NV0 and NV1 to which reference voltage Vref is input, a selection part 90, and a judgment part 70 are provided. The other symbols in FIG. 6 and FIG. 12 represent the same components.

Inspection nodes NV0 and NV1 are one possible embodiment of the pair of inspection nodes of the present invention. Judgment part 70 is one possible embodiment of the second judgment part of the present invention.

In switch part 11, inspection switches SVA0, SVA1, SVB0 and SVB1 are added to switch part 10 in FIG. 1 and FIG. 6. Switch SVA1 turns the connection between inspection node NV1 and sense input node NA on or off, switch SVB1 turns the connection between inspection node NV1 and sense input node NB on or off, switch VA0 turns the connection between inspection node NV0 and sense input node NA on or off, and switch SVB0 turns the connection between inspection node NV0 and inspection input node NB on or off.

Control part 52, in normal operating mode and the first inspection mode, controls switch part 11 and changeover part 202 in the same way as control part 51 in FIG. 6; in addition, it controls switches SVA0, SVA1, SVB0 and SVB1 in an inspection mode (second inspection mode) in which voltage sensing part 20 is inspected. That is, control part 52, in the second inspection mode, controls switches SVA0, SVA1, SVB0 and SVB1 so that inspection nodes NV0 and NV1 and sense input nodes NA and NB are connected in two types of patterns (forward connection, reverse connection).

Control part 52 provides the two types of connections (forward connection, reverse connection) between inspection nodes NV0 and NV1 and sense input nodes NA and NB for each of the two types of connections by changeover part 202 in voltage sensing part 21.

That is, control part 52 connects sense input node NA and input node PA, while sense input node NB and input node PB are connected by changeover part 202, and in this state, it connects inspection nodes NV0 and NV1 and sense input nodes NA and NB in two types of patterns (forward connection, reverse connection). Here, sensed data processing part 40 generates sensed voltage data S40 according to the difference in digital data S30 for the two sensed voltage signals S20 generated when said two patterns are connected by switch part 11 with connections by changeover part 202 held the same.

Control part 52 also provides connections that are the reverse of those described above related to changeover part 202 (sense input node NA and input node PB are connected, while sense input node NB and input node PA are also connected), and in this state, it connects inspection nodes NV0 and NV1 and sense input nodes NA and NB in two types of patterns (forward connection, reverse connection). In this case, sensed data processing part 40 generates sensed voltage data S40 according to the difference between digital data S30 for the two sensed voltage signals S20 generated when said two patterns are connected by switch part 11 with the connections formed by changeover part 202 kept the same.

Selection part 90 selects sensed voltage signal S20 generated in voltage sensing part 21 or one reference voltage Vref input to sensing nodes NV0 and NV1, and inputs it to analog/digital conversion part 30.

Judgment part 70, in the second inspection mode, compares sensed voltage data S40, generated on the basis of the difference between the two sensed voltage data S20 output from voltage sensing part 21, and a reference value corresponding to reference voltage Vref, and determines whether there are abnormalities in voltage sensing part 21 based on the result of said comparison. That is, judgment part 70, in the second inspection mode, uses sensed voltage data S40 for digital data corresponding to reference voltage Vref sensed by voltage sensing part 21 and a reference value corresponding to digital data S30 in which reference voltage Vref has been directly converted by analog/digital conversion part 30, and determines whether there is an abnormality in voltage sensing part 21 based on the result of said judgment.

Judgment part 70 also compares the above-mentioned reference value with each of the two sensed voltage data S40 generated by sensed data processing part 40 when two types of patterns of different polarity are connected by changeover part 202, and determines whether there are abnormalities relating to each of the two types of connection patterns in changeover part 202 based on the comparison result.

First, the case in which sense input node NA and input node PA, and sense input node NB and input node PB are connected by changeover part 202 will be explained.

In this connected state, inspection nodes NV0 and NV1 and sense input nodes NA and NB are connected in two types of patterns of different polarity (forward connection, reverse connection), and if sensed voltage data S40 obtained according to the difference between sensed voltage signals S20 generated in the two types of patterns is "Xvrf1," "Xvrf1" can be represented by the following equation.

Equation 7

$$Xvrf1 = \left(\frac{rf1 \cdot rf2}{rs1 \cdot rs2} + \frac{rf2}{rs3}\right) \times Vref = G1 \times Vref \quad (15)$$

$$G1 = \frac{rf1 \cdot rf2}{rs1 \cdot rs2} + \frac{rf2}{rs3} \quad (16)$$

"Xvrf1" represented in equation (15) corresponds to sensed voltage data S40 obtained when battery cell voltage is sensed where voltage the same as reference voltage Vref is produced, when voltage sensing part 21 is normal.

The difference between "Xvrf1" divided by voltage gain "G1" in equation (16) and reference voltage Vref is found, and if the absolute value of the difference is "E2_1," "E2_1" can be represented by the following equation.

Equation 8

$$E2\_1 = \left|\frac{Xvrf1}{G1} - Vref\right| = 0 \quad (17)$$

As shown in equation (17), error "E21" will ideally be zero. Therefore, when judgment part 70 compares error "E2_1" with a prescribed reference value, and error "E2_1" is larger than the reference value, it is determined that there is an abnormality in voltage sensing part 21.

On the other hand, if sensed voltage data S40 when sense input node NA and input node PB are connected, and sense input node NB and input node PA are connected by changeover part 202 is "Xvrf2," "Xvrf2" can be represented by the following equation.

Equation 9

$$Xvrf2 = -\left(\frac{rf1 \cdot rf2}{rs3 \cdot rs2} + \frac{rf2}{rs1}\right) \times Vref = G2 \times Vref \quad (18)$$

$$G2 = -\left(\frac{rf1 \cdot rf2}{rs3 \cdot rs2} + \frac{rf2}{rs1}\right) \quad (19)$$

The difference between "Xvrf2" divided by voltage gain "G2" in equation (19) and reference voltage Vref is found, and if the absolute value of the difference is "E2_2," "E2_2" can be represented by the following equation.

Equation 10

$$E2\_2 = \left|\frac{Xvrf2}{G2} - Vref\right| = 0 \quad (20)$$

As shown in equation (20), error "E2_2" will ideally be zero. Therefore, when judgment part 70 compares error "E2_2" with a prescribed reference value, and error "E2_2" is larger than the reference value, it is determined that there is an abnormality in voltage sensing part 21.

When error "E2_1" and "E2_2" are compared with a reference value, if an abnormality is recognized in both errors, it is assumed there is an error in signal generating part 201; and if an abnormality is recognized in only one of the errors, it is assumed that an abnormality has occurred in switches SP1-SP4 of changeover part 202.

As explained above, with this embodiment, in the second inspection mode, inspection nodes NV1 and NV0 and sense input nodes NA and NB are connected in two types of patterns (forward connection, reverse connection), and sensed voltage data S40 is generated based on the two sensed voltage signals S20 generated in the two types of patterns. Sensed voltage data S40 represents the sensed voltage value for reference voltage Vref, so that by comparing a reference value set based on reference voltage Vref and sensed voltage data S40, whether an abnormality has occurred in voltage sensing part 21 can be determined based on the comparison result.

With this embodiment, it is possible to inspect at any time whether there is an abnormality in voltage sensing part 21, even after the product has shipped, so that the reliability of voltage inspection results can be improved. Also, if it has been determined that there is an overvoltage in a battery cell based on the voltage sensing result, because the judgment reliability is improved, the reliability and safety of devices in which the battery cells are incorporated can be increased.

Also, with the present invention, by generating sensed voltage data S40 (Xvrf1, Xvrf2), then selecting reference voltage Vref, for each of the two different patterns of different polarity by changeover part 202, and comparing each of the two sensed voltage data S40 generated with the reference value, it is possible to determine whether there are abnormalities in changeover part 202 and whether there are abnormalities in signal generating part 201.

In addition, with this embodiment, by selecting reference voltage Vref with selection part 90, converting reference voltage Vref into digital data S30 by analog/digital conversion part 30, and setting the reference value for judgment part 70 according to the digital data S30, even when the level of reference voltage Vref changes over time, the reference value can be updated to match to the change.

Thus, even when reference voltage Vref changes over time, the relative difference between sensed voltage data S40 (Xvrf1, Xvrf2), obtained as the sensed voltage value for reference voltage Vref, changes in the reference value can be kept to a minimum. That is, lowered judgment accuracy accompanying changes in reference voltage Vref over time can be effectively limited. Therefore, voltage sensing part 21 can be inspected safely even after the product is shipped.

Fourth Embodiment

A fourth embodiment of the present invention will now be explained.

Figure 13:
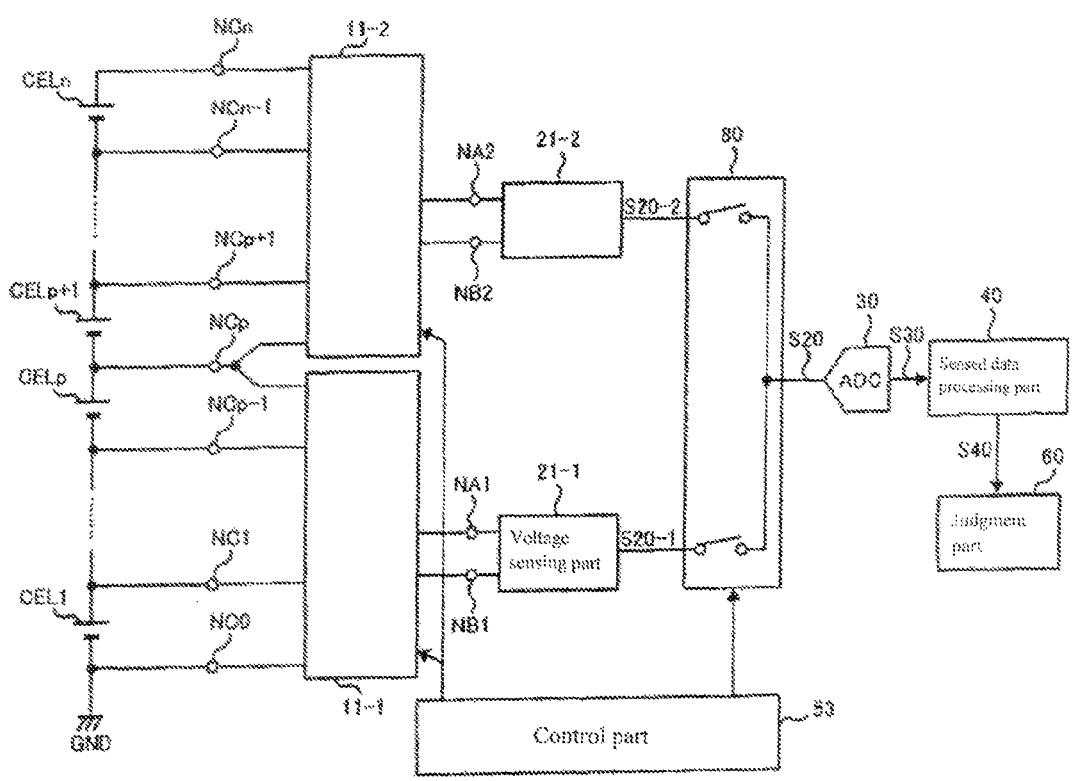
FIG. 13 shows an example of a voltage sensing device pertaining to a fourth embodiment.

FIG. 13 shows an example of the configuration of a voltage sensing device pertaining to a fourth embodiment.

The voltage sensing device shown in FIG. 13 has voltage input nodes NC0-NCn, switch parts 11-1 and 11-2, sense input nodes NA1, NB1, NA2 and NB2, voltage sensing parts 21-1 and 21-2, an analog/digital conversion part 40, a sensed data processing part 40, a control part 53, and a selection part 80. Here, the same symbols in FIG. 13 and FIG. 6 represent the same components.

A unit comprising switch part 11-1, sensing input nodes NA1 and NB1, and voltage sensing part 21-1, and a unit comprising switch part 11-2, sensing input nodes NA2 and NB2, and voltage sensing part 21-2 are each one possible embodiment of the sensing module of the present invention.

Selection part 80 is one possible embodiment of the selection part of the present invention.

Figure 14A:
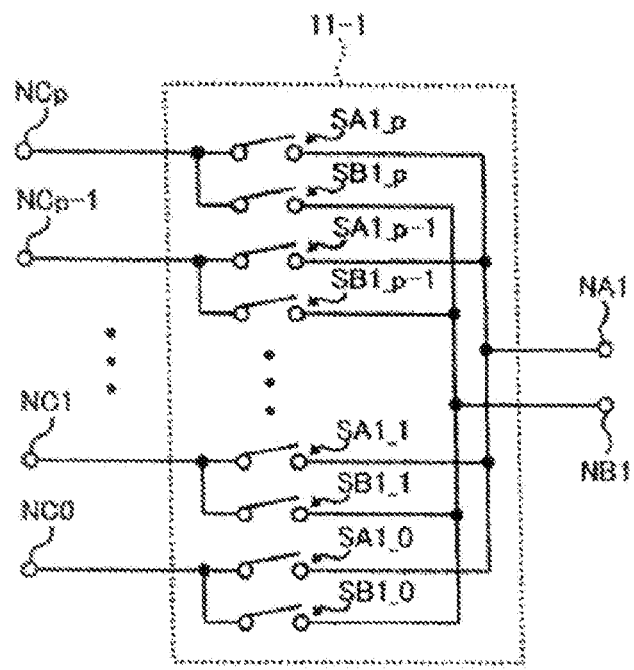
FIG. 14 shows an example of the configuration of the switch part in the voltage sensing device shown in FIG. 13.

Switch part 11-1 is provided with multiple switches that turn connections between voltage input nodes NC0-NCp (where p represents a positive integer less than n) and sense input nodes NA1 and NB1 on or off. For example, switch part 11-1, as shown in FIG. 14(A), has switches SA1_0-SA1_$p$ provided in p+1 current paths between sense input node NA1 and voltage input nodes NC0-NCp, and switches SB1_0-SB1_$p$ provided in p+1 current paths between sense input node NB1 and voltage input nodes NC0-NCp. Switches SA1_$t$ (where t represents an integer from 0 to p) turn connections between voltage input nodes NCt and sense input node NA1 on or off, and switches SB1_$t$ turn connections between voltage input nodes NCt and sense input node NB1 on or off.

Figure 14B:
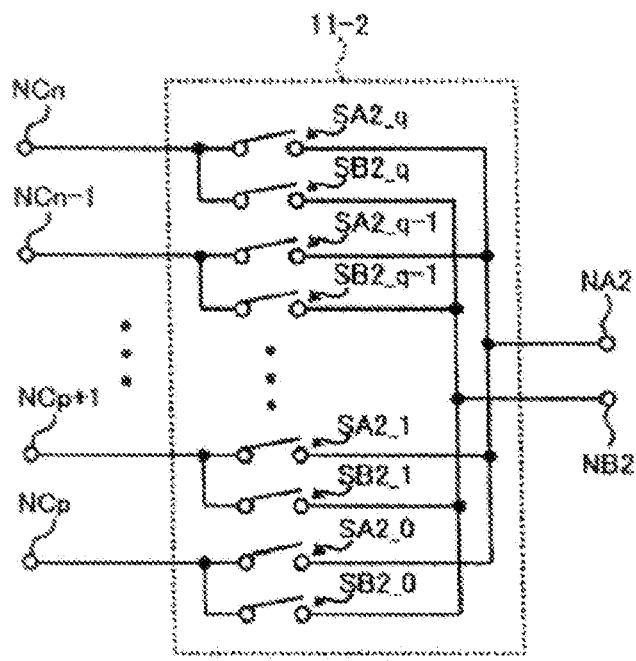

Switch part 11-2 is provided with multiple switches that turn connections between voltage input nodes NCp-NCn (where q represents an integer that satisfies n=p+q) and sense input nodes NA2 and NB2 on or off. For example, switch part 11-2, as shown in FIG. 14(B), has switches SA2_0-SA2_$p$ provided in q+1 current paths between sense input node NA2 and voltage input nodes NCp-NCn, and switches SB2_0-SB2_$q$ provided in q+1 current paths between sense input node NB2 and voltage input nodes NCq-NCn.

Switches SA2_$u$ (where u represents an integer from 0 to q) turn connections between voltage input nodes NCp+u and sense input node NA2 on or off, and switches SB2_$u$ turn connections between voltage input nodes NCp+u and sense input node NB2 on or off.

Each switch of switch parts 11-1 and 11-2 is constructed using series-connected transistors, as shown in FIG. 2 for example.

Voltage sensing parts 21-1 and 21-2 have the same configuration as voltage sensing part 21 shown in FIG. 7, and generate sensed voltage signals S20-1 and S20-2, respectively, using the same operation as voltage sensing part 21 in normal operating mode and in the first inspection mode. Voltage sensing part 21-1 generates sensed voltage signal S20-1 according to the voltage input to sense input nodes NA1 and NB2, and voltage sensing part 20-2 generates sensed voltage signal S20-2 according to the voltage input to sense input nodes NA2 and NB2.

Selection part 80 selects either sensed voltage signal S20-1 generated by voltage sensing part 21-1 or sensed voltage signal S20-2 generated by voltage sensing part 21-1, and said selected sensed voltage signal is input to analog/digital conversion part 30.

Control part 53 controls switch part 11-1 so that the voltage of battery cells CEL1-CELp is sensed by voltage sensing part 21-1, and controls switch part 11-2 so that the voltage of battery cells CELp-CELn is sensed by voltage sensing part 21-2.

That is, control part 53 controls switch part 11-1 to select two voltage input nodes from voltage input nodes NC0-NCq and connect said two selected voltage input nodes and sense input nodes NA1 and NB1 in two types of patterns of different polarity (forward connection, reverse connection). In the same way, control part 53 controls switch part 11-2 to select two voltage input nodes from voltage input nodes NCq-NCn and connect said two selected voltage input nodes and sense input nodes NA2 and NB2 in two types of patterns of different polarity (forward connection, reverse connection).

In this case, control part 53 controls the selection of sensed voltage signals with selection part 80, so that the sensed voltage signal S20-1, S20-2 for each battery cell CEL1-CELn will be converted into digital data S30 by analog/digital conversion part 30.

Control part 53, in the first inspection mode, also controls switch parts 11-1 and 11-2 and voltage sensing parts 21-1 and 21-2 in the same way as control part 51 in the voltage sensing device shown in FIG. 6. Voltage sensing parts 21-1 and 21-2 thus generate sensed voltage signals S20-1 and S20-2 required for judgment by judgment part 60.

Analog/digital conversion part 30 and sensed data processing part 40 are the same as the components with the same symbols in FIG. 1, so that their explanation is omitted.

Here, the operation of the voltage sensing device shown in FIG. 13 will be explained.

Control part 53 selects one of the sensed voltage signals S20-1 or S20-2 with selection part 80. When sensed voltage signal S20-1 is selected, control part 53 selects one battery cell successively from battery cells CEL1-CELp, and connects the pair of voltage input nodes connected to the positive electrode of the selected battery cell and sense input nodes NA1 and NB1 in two types of patterns (forward connection, reverse connection). On the other hand, when sensed voltage signal S20-2 is selected, control part 53 selects one battery cell successively from battery cells CELp+1-CELn, and connects the pair of voltage input nodes connected to the positive electrode of the selected battery cell and sense input nodes NA2, NB2 in two types of patterns (forward connection, reverse connection)

Sensed data processing part 40 acquires each digital data S30 for sensed voltage signal S20-1 generated in the two types of connection patterns each time one battery cell is selected under the control of control part 53, and calculates the difference between the digital data S30 acquired as sensed voltage data S40 for the given battery cell.

In the voltage sensing device pertaining to this embodiment, too, because high-precision sensed voltage data S40 in which error components caused by the input bias voltage and offset voltage for the voltage sensing parts 21-1, 21-2 has been cancelled in the same way as in each of the embodiments described previously, the same effects as the voltage sensing device shown in FIG. 1 are achieved.

With the voltage sensing device shown in FIG. 13, too, multiple groups of circuits comprising one voltage sensing part and input resistors and switches connected to it (hereafter sometimes referred to as "sensing module") are provided, and because the current paths from the voltage sensing nodes to the voltage sensing part are divided for each sensing module, the resistance values of the input resistors can be set to a different value for each sensing module. For example, for a battery cell with lower voltage relative to reference potential Vm, the resistance value of the input resistor in the sensing module connected to it can be set lower. Thus, with a sensing module in which the resistance value is lowered, the current flowing to the input resistor increases, and the speed at which a sensed voltage signal is generated in the voltage sensing part is improved, so that the voltage sensing time can be shortened. In addition, by providing multiple sensing modules, it is possible to moderate the delay time in generating sensed voltage signals caused by switching of the switch part.

For example, selection part 80 will switch the sensing module each time a sensed voltage signal S20-1, S20-2 or sensed voltage data S40 are generated for a pair of voltage input nodes. Control part 53 then controls the switch part 11-1, 11-2 (FIG. 14) of the given sensing module so that connection of the pair of voltage input nodes and the pair of sense input nodes is completed before switching is performed by selection part 80. That is, the switching of the switch parts 11-1, 11-2 in the given sensing module is completed before selection part 80 switches to the next sensing module, and the start time for generating sensed voltage signals S10-1, S20-2 by the voltage sensing parts 20-1, 20-2 is reduced. In this way, the rise of sensed voltage signals S20-1, S20-2 in the voltage sensing parts 21-1, 21-2 is moved up, and the conversion wait time provided for stabilization of the input signal S20 in analog/digital conversion part 30 can be reduced, so that the time required to acquire sensed voltage data S40 can be shortened.

Fifth Embodiment

A fifth embodiment of the present invention will now be explained.

Figure 15:
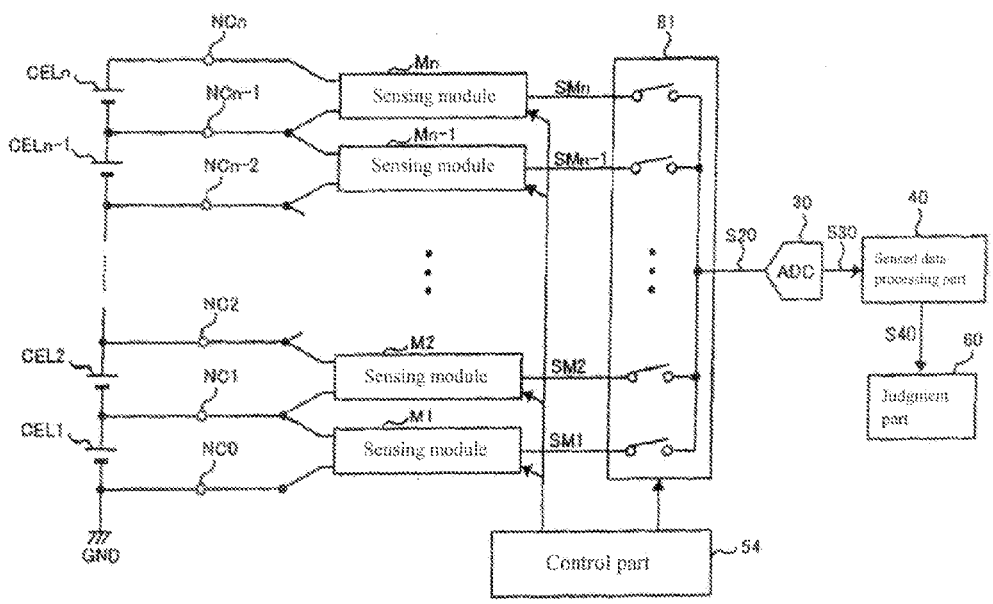
FIG. 15 shows an example of a voltage sensing device pertaining to a fifth embodiment.

FIG. 15 shows an example of the configuration of a voltage sensing device pertaining to a fifth embodiment.

The voltage sensing device shown in FIG. 15 has voltage input nodes NC0-NCn, sensing modules M1-Mn, selection part 81, analog/digital conversion part 30, sensed data processing part 40, control part 54, and judgment part 60. Here, the same symbols as in FIG. 6 and FIG. 15 represent the same components.

Sensing modules M1-Mn are each one possible embodiment of the sensing module of the present invention. Control part 81 is one possible embodiment of the selection part of the present invention.

Figure 16:
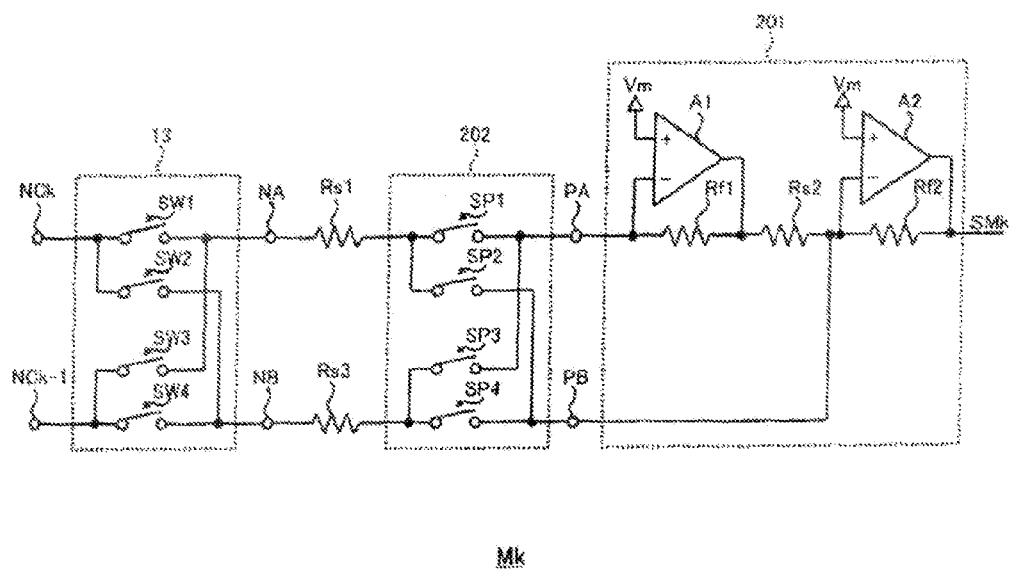
FIG. 16 shows an example of the configuration of a sensing module in the voltage sensing device shown in FIG. 15.

Sensing modules Mk (k=1–n), as shown in FIG. 16, in addition to having the same configuration as voltage sensing part 21 shown in FIG. 7, also have a switch part 13 at a stage subsequent to sense input nodes NA and NB. Switch part 13 corresponds to switch part 10 in the voltage sensing device shown in FIG. 6.

Switch part 13 is provided with four switches SW1-SW4 that turn connections between voltage input nodes NCk and NCk-1 and sense input nodes NA and NB on or off. Switch SW1 turns the connection between voltage input node NCk and sense input node NA on or off, switch SW2 turns the connection between voltage input node NCk and sense input node NB on or off, switch SW3 turns the connection between voltage input node NCk-1 and sense input node NA on or off, and switch SW4 turns the connection between voltage input node NCk-1 and sense input node NB on or off.

Sensing module Mk inputs the signal generated by signal generating part 201 to selection part as sensed voltage signal SMk. Selection part 81 selects one sensing module from sensing modules M1-Mn, and inputs the sensed voltage signal generated by said selected sensing module to analog/digital conversion part 30.

Control part 54 controls selection part 81 so that one sensing module is selected successively from sensing modules M1-Mn. Then, in the sensing module selected by selection part 81, switch part 13 of said sensing module is controlled so that the pair of voltage input nodes and the pair of sense input nodes are connected in two types of patterns of different polarity (forward connection, reverse connection).

Control part 54, in the first inspection mode, also controls switch part 13 of sensing modules M1-Mn and changeover part 202 in the same way as control part 51 in the voltage sensing device shown in FIG. 6. Sensing modules M1-Mn thereby generate sensed voltage signals SM1-SMn required for judgment by judgment part 60.

In the voltage sensing device pertaining to this embodiment, too, because sensed signals are generated by forward connection and reverse connection in each sensing module M1-Mn, the same as for each of the voltage sensing devices described previously, it is possible to acquire high-precision sensed voltage data S40 in the sensed data processing part 40. The voltage sensing time can also be shortened using the same method as the voltage sensing device shown in FIG. 13 by providing multiple sensing modules.

Several embodiments of the present invention were explained above, however, the present invention is not limited to the above-mentioned embodiments, but encompasses many variations without departing from the spirit and scope of the invention as defined by the appended claims.

With the above-mentioned embodiments, an example in which the voltage of each battery cell is sensed was given, but the present invention is not limited thereto. For example, in the voltage sensing device shown in FIG. 1 and FIGS. 5(A) and 5(B), any pair of voltage input nodes can be selected from three or more voltage input nodes and connected to the pair of sense input nodes, so that it is possible to sense the voltage of a group of cells that are connected in series.

With the fourth and fifth embodiments (FIG. 13, FIG. 15), too, a judgment part 60 that inspects the switch part was provided, but in addition, judgment part 70 that judges the voltage sensing part could also be provided. Or, in place of judgment part 60, judgment part 70 could be provided. With the third embodiment (FIG. 12), both judgment parts 60 and 70 are provided, but only judgment part 70 could be provided. When only judgment part 70 is provided, the switchover part 202 included in the voltage sensing part (sensing module) could be eliminated.

The switches in the switch part could also all be consolidated into one circuit, as shown in FIGS. 2(A) and 2(B), and the two types of circuit configurations could be mixed. For example, battery cells CEL0-CELn could be divided into two groups, a high-potential group and a low-potential group, and for the switches connected to battery cells in the low-potential group, the switches shown in FIG. 2(A) could be used, and for the switches connected to the battery cells in the high-potential group, the switches shown in FIG. 2(B) could be used.

With the voltage sensing device shown in FIG. 13, for example, the switches shown in FIG. 2(A) could be used for switch part 11-1 connected to the low-potential side, and the switches shown in FIG. 2(B) could be used for switch part 11-2 connected to the high-potential side.

In addition, with the second embodiment (FIG. 6), whether there are abnormalities in switch part 10 and input resistors Rs1 and Rs3 is determined based on the two sensed voltage data (Xdif_P, Xdif_N ... equation (6), (9)) generated by sensed data processing part 40, but the present invention is not limited thereto. That is, the aforementioned judgment could be performed directly based on the four sensed voltage signals X1_P,X2_P,X1_N,X2_N ... equations (4), (5), (7), (8) generated in voltage sensing part 21.

In the four connection patterns in the first inspection mode (FIGS. 10(A) and 10(B), and FIGS. 11(A) and 11(B)), two sets of two types of connection patterns, in which the connection relationships between the pair of voltage input nodes Nck, Nck-1 and the pair of input nodes PA, PB are the same, and in which the input resistors Rs1, Rs3 inserted in each connection path between the pair of voltage input nodes Nck, Nck-1 and the pair of input nodes PA, PB are different, are present (FIG. 10(A) and FIG. 11(B), FIG. 10(B) and FIG. 11(A)).

For example, judgment part 60 could also perform the aforementioned judgment (|(X1_P)−(X2_N)|, |(X2_P)−(X1_N)|) based on the difference between the two sensed voltage signals S20 generated in the two types of connection patterns.

With the configuration shown in FIG. 6 and FIG. 7, because the two input resistors Rs1, Rs3 have approximately equal resistance values, and the pair of input nodes PA, PB are held at reference potential Vm, the current that flows from one voltage input node NCk, NCk-1 to one input node PA, PB will be equal, regardless of input resistors Rs1, Rs3 inserted in the current paths.

If the currents input to the pair of input nodes PA, PB are equal, sensed voltage signals S20 generated by signal generating part 201 will be equal.

Thus, in the first inspection mode, the two sensed voltage signals S20 "X1_P" and "X2_N", "X2_P" and "X1_N" generated in the two types of patterns in which the connection relationships of the pair of the aforementioned voltage input nodes Nck, Nck-1 and the pair of the aforementioned input PA, PB are the same and the input resistors inserted in each connection path between the pair of voltage input nodes Nck, Nck-1 and the pair of input nodes PA, PB (FIG. 10(A) and FIG. 11(B), FIG. 10(B) and FIG. 11(A)) will be approximately equal in a normal state.

Therefore, setting part 60 compares the difference between said two sensed voltage signals S20 (the difference between "X1_P" and "X2_N" and the difference between "X2_P" and "X1_N") with a prescribed reference value, and when the difference exceeds the reference value, it can be determined that an abnormality has occurred in switch part 10 or input resistor Rs1 or Rs3.

For example, setting part 60 could also make a judgment based on the result of comparing either "|(X1_P)−(X2_N)|" or "|(X2_P)−(X1_N)|", or it could make a judgment based on the result of comparing both "|(X1_P)−(X2_N)|" and "|(X2_P)−(X1_N)|".

The invention claimed is:

1. A voltage sensing device that comprising:
   multiple voltage input nodes;
   a pair of sense input nodes;
   a switch part provided with multiple switches that turn connections between the voltage input nodes and the pair of sense input nodes on or off;
   a first sensed signal generating part that amplifies the voltage input to each of the pair of sense input nodes with a different gain and generates a first sensed signal according to a sum of or difference between amplification results;
   a control part that controls the switch part so that a pair of voltage input nodes is selected from the multiple voltage input nodes, and said selected pair of voltage input nodes and the pair of sense input nodes are connected in two patterns of different polarity; and
   a second sensed signal generating part that generates a second sensed signal according to the difference between the two first sensed signals generated by the first sensed signal generating part in the two connection patterns.

2. The voltage sensing device described in claim 1, wherein the first voltage sensing part comprises:
   a signal generating part that holds each of the pair of input nodes at a reference potential and generates the first sensed signal according to the sum of or difference between the currents input to said pair of input nodes;
   and two input resistors that are connected to the pair of input nodes of the signal generating part and the pair of sense input nodes.

3. The voltage sensing device described in claim 2 comprising:
   a changeover part that switches connections between the pair of input nodes of the sensed signal generating part and the two input resistors;
   a first judgment part that determines whether there are abnormalities in the switch part and the input resistors;
   wherein the two input resistors have approximately equal resistance values;
   wherein the control part, in a first inspection mode, controls the switch part so that a pair of voltage input nodes is selected from the multiple voltage input nodes while said selected pair of voltage input nodes and the pair of sensed input nodes are connected in two patterns of different polarity, and also controls the changeover part so that the pair of input nodes of the signal generating part and the two input resistors are connected in two patterns of different polarity in each of said two patterns of different polarity; and
   the first judgment part, in the first inspection mode, performs the judgment based on the difference between the two first sensed signals generated with two connection patterns in which the connection relationships between the pair of voltage input nodes and the pair of input nodes are the same, and the input resistors, which are inserted in each of the connection paths between the pair of the voltage input nodes and the pair of input nodes, are different.

4. The voltage sensing device described in claim 3 wherein the second sensed signal generating part, in the first inspection mode, generates the second sensed signal according to the difference between the two first sensed signals generated by the first sensed signal generating part when the changeover part has formed the two connection patterns with the connection formed by the switch part held the same; and the first judgment part, in the first inspection mode, performs the judgment based on the two second sensed signals generated by the second sensed signal generating part when the switch part forms the two connection patterns.

5. The voltage sensing device described in claim 4, wherein the multiple voltage input nodes include a pair of inspection nodes into which a reference voltage is input; and and the control part, in a second inspection mode, controls the switch part so that the pair of inspection nodes and the pair of sense input nodes are connected in two patterns of different polarity, and includes a second judgment part that compares the second sensed signals generated in the second inspection mode with a reference value set according to the reference voltage and determines whether there are abnormalities in the first inspection signal generating part based on the difference in said comparison result.

6. The voltage sensing device described in claim 4, wherein the signal generating part comprises:

a first amplifying part that amplifies the difference between the voltage at one of the input nodes of the pair of input nodes and the reference voltage;

a first resistor that connects the output node of the first amplifying part and the one input node;

a second amplifying part that amplifies the difference between the voltage at another input node of the pair of input nodes and the reference voltage;

a second resistor that connects the output node of the second amplifying part and the other input node; and a third resistor that connects the output node of the first amplifying part and the other input node.

7. The voltage sensing device described in claim 4, wherein each switch of the switch part comprises: two NMOS or PMOS transistors connected in series; a constant-voltage element connected between the control terminals of the two transistors and an intermediate connection node; and a drive circuit that supplies equal drive current to the control terminals of the two transistors.

8. The voltage sensing device described in claim 3, wherein the multiple voltage input nodes include a pair of inspection nodes into which a reference voltage is input; and the control part, in a second inspection mode, controls the switch part so that the pair of inspection nodes and the pair of sense input nodes are connected in two patterns of different polarity, and includes a second judgment part that compares the second sensed signals generated in the second inspection mode with a reference value set according to the reference voltage and determines whether there are abnormalities in the first inspection signal generating part based on the difference in said comparison result.

9. The voltage sensing device described in claim 8, wherein the signal generating part comprises:

a first amplifying part that amplifies the difference between the voltage at one of the input nodes of the pair of input nodes and the reference voltage;

a first resistor that connects the output node of the first amplifying part and the one input node;

a second amplifying part that amplifies the difference between the voltage at another input node of the pair of input nodes and the reference voltage;

a second resistor that connects the output node of the second amplifying part and the other input node; and a third resistor that connects the output node of the first amplifying part and the other input node.

10. The voltage sensing device described in claim 8, wherein each switch of the switch part comprises:

two transistors of the same conductivity type connected in series;

a constant-voltage element connected between the control terminals of the two transistors and an intermediate connection node; and a drive circuit that supplies equal drive current to the control terminals of the two transistors.

11. The voltage sensing device described in claim 8 wherein the second sensed signal generating part, in the second inspection mode, generates the second sensed signals according to the difference between the two first sensed signals generated by the first sensed signal generating part when the switch part forms the two patterns while the connections formed by the changeover part are kept the same; and the judgment part, in the second inspection mode, determines whether there are abnormalities in the first inspection signal generating part, based on the result of comparing the reference value with each of the two second sensing signals generated by the second sensed signal generating part when the changeover part forms two patterns of different polarity.

12. The voltage sensing device described in claim 11 comprising:

an analog/digital conversion part that converts the first sensed signal and the reference voltage into digital data; and wherein the second judgment part, in the second inspection mode, determines whether there are abnormalities in the first sensed signal generating part, based on the comparison result of the second sensed signal generated according to the two digital data, in which the two first sensed signals generated by the first sensed signal generating part have been converted by the analog/digital conversion part, and the reference value set according the digital data into which the reference voltage has been converted by the analog/digital conversion part.

13. The voltage sensing device described in claim 11, wherein the signal generating part comprises:

a first amplifying part that amplifies the difference between the voltage at one of the input nodes of the pair of input nodes and the reference voltage;

a first resistor that connects the output node of the first amplifying part and the one input node;

a second amplifying part that amplifies the difference between the voltage at another input node of the pair of input nodes and the reference voltage;

a second resistor that connects the output node of the second amplifying part and the other input node; and a third resistor that connects the output node of the first amplifying part and the other input node.

14. The voltage sensing device described in claim 8 comprising:

an analog/digital conversion part that converts the first sensed signal and the reference voltage into digital data; and wherein the second judgment part, in the second inspection mode, determines whether there are abnormalities in the first sensed signal generating part, based on the comparison result of the second sensed signal generated according to the two digital data, in which the two first sensed signals generated by the first sensed signal generating part have been converted by the analog/digital conversion part, and the reference value set according the digital data into which the reference voltage has been converted by the analog/digital conversion part.

15. The voltage sensing device described in claim 3, wherein the signal generating part comprises:
    a first amplifying part that amplifies the difference between the voltage at one of the input nodes of the pair of input nodes and the reference voltage;
    a first resistor that connects the output node of the first amplifying part and the one input node;
    a second amplifying part that amplifies the difference between the voltage at another input node of the pair of input nodes and the reference voltage;
    a second resistor that connects the output node of the second amplifying part and the other input node; and
    a third resistor that connects the output node of the first amplifying part and the other input node.

16. The voltage sensing device described in claim 1, wherein each switch of the switch part comprises: two NMOS or PMOS transistors connected in series; a constant-voltage element connected between the control terminals of the two transistors and an intermediate connection node; and a drive circuit that supplies equal drive current to the control terminals of the two transistors.

17. The voltage sensing device described in claim 1, wherein the switch part has multiple sensing modules, each of which comprises the pair of sense input nodes and the first sensed signal generating part; and
    a selection part that selects one of the sensing modules from the multiple sensing modules, and that inputs the first sensed signal generated by the first sensed signal generating part of said selected sensing module to the second sensed signal generating part.

18. A voltage sensing device that comprises multiple voltage input nodes, each of which is connected to the connection node of multiple cells connected in series, comprising:
    a first switch circuit for selectively connecting two voltage input nodes, selected from the voltage input nodes, to a first and a second node;
    a second switch circuit for selectively connecting the first and second nodes to a third and a fourth node, respectively;
    multiple input resistors, each of which is provided in the multiple current paths formed between the multiple voltage input nodes and the third and fourth nodes; and
    a voltage sensing circuit connected to the third and fourth nodes for sensing a voltage difference that appears between the third and fourth nodes,
    wherein the voltage sensing circuit comprises:
    a first operational amplifier, the negative input terminal of which is connected to the third node, and the positive input terminal of which is connected to a voltage supply terminal;
    a second operational amplifier, the negative input terminal of which is connected to the fourth node and the positive input terminal of which is connected to the voltage supply terminal;
    a first resistor connected between the output terminal and the negative input terminal of the first operational amplifier;
    a second resistor connected between the output terminal and the negative input terminal of the second operational amplifier; and
    a third resistor connected between the output terminal of the first operational amplifier and the negative input terminal of the second operational amplifier,
    wherein, in a first state in which one of the two voltage input nodes selected from the multiple voltage input nodes and the first node are connected, and the other of the two selected voltage nodes and the second node are connected;
    the voltage sensing circuit outputs a first sensed voltage when the first node and third node are connected and the second and fourth nodes are connected;
    the voltage sensing circuit outputs a second sensed voltage when the first node and the fourth node are connected and the second node and the third node are connected so that a first differential voltage, which is the difference between the first sensed voltage and the second sensed voltage, is generated;
    and wherein, in a second state in which one the two selected voltage input nodes and the second node are connected, and the other of the two selected voltage input nodes and the first node are connected;
    the voltage sensing circuit outputs a third sensed voltage when the first node and the third node are connected and the second node and the fourth node are connected;
    the voltage sensing circuit outputs a fourth sensed voltage when the first node and the fourth node are connected and the second node and the third node are connected, so that a second differential voltage, which is the difference between the third sensed voltage and the fourth sensed voltage, is generated; and
    inspection of the first switch circuit is performed based on the first and second differential voltages.

19. The voltage sensing device described in claim 18, wherein each switch included in the first switch circuit comprises:
    a first and a second MOS transistor, the source and gate of which are connected to each other;
    a resistance element connected between the gate and source of the first and second MOS transistors;
    a constant-voltage element connected in parallel with the resistance element; and
    a constant-current circuit that supplies constant current to the gates of the first and second MOS transistors,
    wherein the switches become conductive when the constant-current circuit supplies constant current to the gates.

20. The voltage sensing device described in claim 18 that comprises a first and a second inspection node;
    a voltage supply circuit that applies a prescribed voltage between the first and second inspection nodes; and
    a third switch circuit for selectively connecting the first and second inspection nodes and the first and second nodes,
    wherein a first voltage value that is sensed with the voltage sensing circuit and a reference value based on the prescribed voltage are compared, and the voltage sensing circuit is inspected by switching the connection relationships between the first and second inspection nodes and the first and second nodes.

* * * * *